(12) United States Patent
Kim et al.

(10) Patent No.: US 11,233,064 B2
(45) Date of Patent: Jan. 25, 2022

(54) SEMICONDUCTOR DEVICE

(71) Applicant: Samsung Electronics Co., Ltd., Suwon-si (KR)

(72) Inventors: Ki Hyun Kim, Hwaseong-si (KR); Seung Wan Hong, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 89 days.

(21) Appl. No.: 16/710,726

(22) Filed: Dec. 11, 2019

(65) Prior Publication Data

US 2020/0194458 A1    Jun. 18, 2020

(30) Foreign Application Priority Data

Dec. 14, 2018   (KR) .......................... 10-2018-0161563

(51) Int. Cl.
*H01L 27/11578*    (2017.01)
*H01L 27/11582*    (2017.01)
(Continued)

(52) U.S. Cl.
CPC .... *H01L 27/11582* (2013.01); *H01L 21/0223* (2013.01); *H01L 21/02271* (2013.01); *H01L 27/1157* (2013.01); *H01L 27/11565* (2013.01); *H01L 29/40117* (2019.08); *H01L 29/4234* (2013.01); *H01L 29/42368* (2013.01); *H01L 29/4991* (2013.01); *H01L 29/513* (2013.01); *H01L 29/7926* (2013.01);
(Continued)

(58) Field of Classification Search
CPC ................................................ H01L 27/11578
See application file for complete search history.

(56) References Cited

U.S. PATENT DOCUMENTS 8,247,857 B2    8/2012  Ozawa et al.
9,831,268 B2   11/2017  Alsmeier
(Continued)

FOREIGN PATENT DOCUMENTS

JP       2012-146773 A    8/2012
KR  10-2011-0034816 A    4/2011
(Continued)

*Primary Examiner* — Christopher A Johnson
(74) *Attorney, Agent, or Firm* — Muir Patent Law, PLLC

(57) ABSTRACT

The semiconductor device includes interlayer insulating layers, a gate pattern and a vertical memory structure. The interlayer insulating layers are stacked on the substrate to be spaced apart from each other. The gate pattern includes an overlapping portion disposed vertically between the interlayer insulating layers, and an extension portion extending from the overlapping portion in a horizontal direction parallel to an upper surface of the substrate. The vertical memory structure includes a channel semiconductor layer and a dielectric structure, the channel semiconductor layer extends in a direction perpendicular to the substrate upper surface to have side surfaces that face side surfaces of the interlayer insulating layers and a side surface of the extension portion. The dielectric structure is disposed between the channel semiconductor layer and the gate pattern and extends between the channel semiconductor layer and the interlayer insulating layers, and the extension portion has a vertical thickness less than that of the overlapping portion.

18 Claims, 23 Drawing Sheets

(51) Int. Cl.
*H01L 29/423* (2006.01)
*H01L 29/49* (2006.01)
*H01L 27/11565* (2017.01)
*H01L 29/51* (2006.01)
*H01L 21/02* (2006.01)
*H01L 21/28* (2006.01)
*H01L 27/1157* (2017.01)
*H01L 29/792* (2006.01)
*H01L 27/11575* (2017.01)

(52) U.S. Cl.
CPC ...... *H01L 21/0214* (2013.01); *H01L 21/0217* (2013.01); *H01L 21/02164* (2013.01); *H01L 27/11575* (2013.01)

(56) References Cited

U.S. PATENT DOCUMENTS

| | | |
|---|---|---|
| 2010/0038699 A1 | 2/2010 | Katsumata et al. |
| 2011/0073866 A1 | 3/2011 | Kim et al. |
| 2013/0083601 A1 | 4/2013 | Liu et al. |
| 2013/0198577 A1 | 8/2013 | Oh et al. |
| 2014/0008714 A1* | 1/2014 | Makala ............ H01L 27/11578 257/324 |
| 2014/0264527 A1 | 9/2014 | Koval et al. |
| 2014/0284695 A1* | 9/2014 | Won .................. H01L 29/42344 257/324 |
| 2014/0291747 A1 | 10/2014 | Simsek-Ege et al. |
| 2015/0017772 A1 | 1/2015 | Waite et al. |
| 2016/0071860 A1 | 3/2016 | Kai et al. |
| 2018/0033799 A1* | 2/2018 | Kanamori ......... H01L 27/11582 |
| 2018/0240810 A1* | 8/2018 | Tsuda .................. H01L 29/7827 |
| 2019/0296039 A1* | 9/2019 | Maeda ............. H01L 29/66833 |

FOREIGN PATENT DOCUMENTS

| | | |
|---|---|---|
| KR | 10-2013-0087935 A | 8/2013 |
| KR | 10-1329586 B1 | 11/2013 |
| KR | 10-2014-0053392 A | 5/2014 |
| KR | 10-2014-0115436 A | 10/2014 |
| KR | 10-2015-0106435 A | 9/2015 |
| KR | 10-2015-0109409 A | 10/2015 |
| KR | 10-2016-0030262 A | 3/2016 |
| KR | 10-2017-0048393 A | 5/2017 |

* cited by examiner

SEMICONDUCTOR DEVICE

CROSS-REFERENCE TO RELATED APPLICATION(S)

This application claims benefit of priority to Korean Patent Application No. 10-2018-0161563, filed on Dec. 14, 2018 in the Korean Intellectual Property Office, the disclosure of which is incorporated herein by reference in its entirety.

BACKGROUND

1. Field

The present inventive concept relates to a semiconductor device, and more particularly, to a semiconductor device including gate patterns and a vertical memory structure.

2. Description of Related Art

To increase the price competitiveness of products, demand for improvements in the degree of integration of semiconductor devices is increasing. To improve the degree of integration of semiconductor devices, semiconductor devices, including gates stacked while being spaced apart from each other in a direction perpendicular to an upper surface of a semiconductor substrate, have been developed. As the number of stacked gates increases, interference between data storage areas facing the gates is increasing.

SUMMARY

An aspect of the present inventive concept is to provide a semiconductor device in which a degree of integration may be improved.

An aspect of the present inventive concept is to provide a semiconductor device in which interference between data storage areas may be prevented.

According to an aspect of the present inventive concept, a semiconductor device includes a stacked structure including interlayer insulating layers and cell gate patterns alternately stacked on a substrate, and a vertical memory structure disposed on the substrate and having sides facing sides of the interlayer insulating layers and the cell gate patterns. The cell gate patterns include overlapping portions vertically overlapping the interlayer insulating layers, and extension portions extending from the overlapping portions in a direction parallel to an upper surface of the substrate and which do not vertically overlap the interlayer insulating layers. Each of the extension portions has a vertical thickness less than a vertical thickness of each of the overlapping portions. The vertical memory structure includes a channel semiconductor layer extending in a direction perpendicular to the upper surface of the substrate, and a dielectric structure disposed between the channel semiconductor layer and the stacked structure. The dielectric structure includes protruding regions horizontally extending between the extension portions to vertically overlap the extension portions, the horizontally protruding regions facing the interlayer insulating layers.

According to an aspect of the present inventive concept, which in one example is the same embodiment as the previously-mentioned aspect, a semiconductor device includes a stacked structure including interlayer insulating layers and cell gate patterns alternately stacked on a substrate, and a vertical memory structure disposed on the substrate and having sides facing sides of the interlayer insulating layers and the cell gate patterns. The cell gate patterns include overlapping portions overlapping the interlayer insulating layers and extension portions extending from the overlapping portions in a horizontal direction parallel to an upper surface of the substrate, each of the cell gate patterns includes a first material layer and a second material layer, the first material layer being interposed between the second material layer and the vertical memory structure and extending between the second material layer and the interlayer insulating layers, the vertical memory structure includes a channel semiconductor layer extending in a vertical direction perpendicular to the upper surface of the substrate, and a dielectric structure disposed between the channel semiconductor layer and the stacked structure, the dielectric structure includes a data storage layer, and the data storage layer is disposed between the channel semiconductor layer and the cell gate patterns and extends between the channel semiconductor layer and the interlayer insulating layers to overlap the extension portions in the vertical direction.

According to an aspect of the present inventive concept, which in one example is the same embodiment as the previously-mentioned aspect a semiconductor device includes interlayer insulating layers, a gate pattern and a vertical memory structure stacked on a substrate. The interlayer insulating layers are stacked on the substrate to be spaced apart from each other. The gate pattern includes an overlapping portion disposed vertically between the interlayer insulating layers, and an extension portion extending from the overlapping portion in a direction parallel to an upper surface of the substrate and which does not overlap the interlayer insulating layers in a vertical direction. The vertical memory structure includes a channel semiconductor layer and a dielectric structure, the channel semiconductor layer extends in a direction perpendicular to the upper surface of the substrate to have side surfaces that face side surfaces of the interlayer insulating layers and a side surface of the extension portion of the gate pattern, the dielectric structure is disposed between the channel semiconductor layer and the gate pattern and extends between the channel semiconductor layer and the interlayer insulating layers, and the extension portion has a vertical thickness less than a vertical thickness of the overlapping portion.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
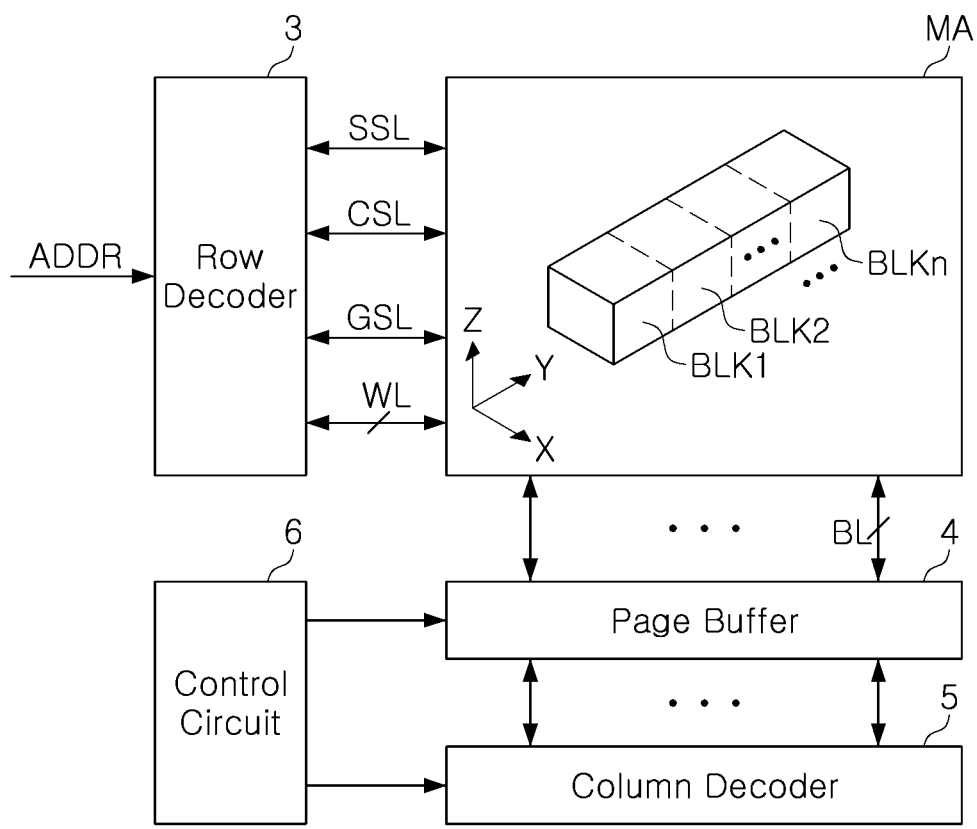
FIG. 1 is a schematic block diagram of a semiconductor device according to an example embodiment of the present inventive concept.

An example of a semiconductor device according to an example embodiment of the present inventive concept will be described with reference to FIG. 1. FIG. 1 is a schematic block diagram of a semiconductor device according to an example embodiment.

Referring to FIG. 1, a semiconductor device 1 according to an example embodiment may include a memory array region MA, a row decoder 3, a page buffer 4, a column decoder 5, and a control circuit 6. The memory array region MA may include a plurality of memory blocks BLK1, BLK2, . . . , and BLKn.

Each of the memory blocks BLK1, BLK2, . . . , and BLKn in the memory array region MA may include memory cells arranged in a plurality of rows and columns. The memory cells included in the memory array region MA may be electrically connected to the row decoder 3 through word lines WL, at least one common source line CSL, string select lines SSL, at least one ground select line GSL or the like, and may be electrically connected to the page buffer 4 and the column decoder 5 through bit lines BL.

In an example embodiment, among the memory cells, memory cells arranged in a single row may be connected to a single word line WL, and memory cells arranged in a single column may be connected to a single bit line BL.

The row decoder 3 may be commonly connected to the memory blocks BLK1, BLK2, . . . and BLKn, and may provide a driving signal to word lines WL of the memory blocks BLK1, BLK2, . . . , and BLKn selected by a block select signal. For example, the row decoder 3 receives external address information ADDR, decodes the received address information ADDR, and determines a voltage supplied to at least a portion of the word lines WL, the common source line CSL, the string select lines SSL and the ground select line GSL, electrically connected to the memory blocks BLK1, BLK2, . . . , and BLKn.

The page buffer 4 may be electrically connected to the memory array region MA through the bit lines BL. The page buffer 4 may be connected to a bit line BL, selected by an address decoded by the column decoder 5. The page buffer 4 may temporarily store data to be stored in memory cells, or may sense data stored in memory cells, depending on an operating mode. For example, the page buffer 4 may operate as a write driver circuit in a program operating mode, and may operate as a sense amplifier circuit in a read operating mode. The page buffer 4 may receive power, for example, a voltage or a current, from a control logic, and may provide the received power to the selected bit line BL.

The column decoder 5 may provide a data transmission path between the page buffer 4 and an external device, for example, a memory controller. The column decoder 5 may decode an externally input address to select one of the bit lines BL.

The column decoder 5 may be commonly connected to the memory blocks BLK1, BLK2, . . . , and BLKn, and may provide data to the bit lines BL of the memory block BLK1, BLK2, . . . , BLKn selected by a block select signal.

The control circuit 6 may control an overall operation of the semiconductor device 1. The control circuit 6 may receive a control signal and an external voltage, and may operate in response to the received control signal. The control circuit 6 may include a voltage generator generating voltages, for example, a program voltage, a read voltage, a removal voltage, or the like, required for internal operations, using an external voltage. The control circuit 6 may control reading, writing, and/or erasing operations in response to control signals.

The semiconductor device 1 described above, and each of the example semiconductor devices described below, may be a semiconductor chip formed on a die from a wafer. The term "semiconductor device" may refer to such a semiconductor chip, and may also refer more generally to a semiconductor package that includes one or more semiconductor chips formed on a package substrate and covered with an encapsulant.

Figure 2:
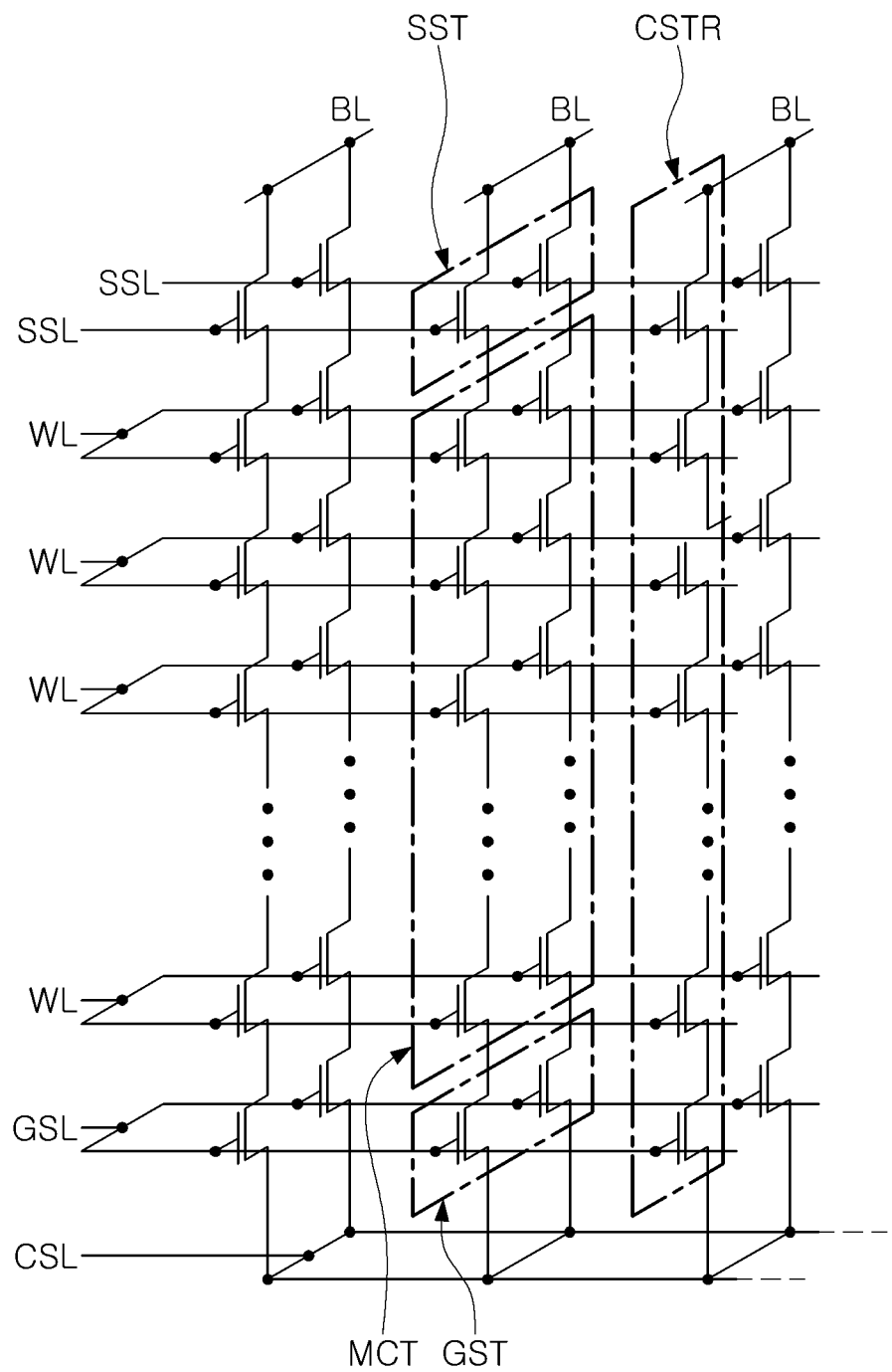
FIG. 2 is a circuit diagram conceptually illustrating a memory array region of a semiconductor device according to an example embodiment of the present inventive concept.

An example of a circuit disposed in the memory array region (MA in FIG. 1) of the semiconductor device 1 illustrated in FIG. 1 will be described with reference to FIG. 2. FIG. 2 is a circuit diagram conceptually illustrating the memory array region (MA in FIG. 1).

Referring to FIGS. 1 and 2, a semiconductor device according to an example embodiment may include a common source line CSL, bit lines BL, and a plurality of cell strings CSTR disposed between the common source line CSL and the bit lines BL. The common source line CSL, the bit lines BL, and the plurality of cell strings CSTR may be disposed in the memory array region MA.

The plurality of cell strings CSTR may be connected to each of the bit lines BL in parallel. The plurality of cell strings CSTR may be connected in common to the common source line CSL. Each of the plurality of cell strings CSTR may include a lower selection transistor GST, memory cells MCT, and an upper selection transistor SST, which may be connected in series.

The memory cells MCT may be connected in series between the lower selection transistor GST and the upper selection transistor SST. Each of the memory cells MCT may include a data storage layer capable of storing information.

The upper selection transistor SST may be electrically connected to the bit lines BL, and the lower selection transistor GST may be electrically connected to the common source line CSL.

As the upper selection transistor SST, a plurality of upper selection transistors may be disposed and may be controlled by string select lines SSL. The memory cells MCT may be controlled by a plurality of word lines WL.

The lower selection transistor GST may be controlled by the ground select line GSL. The common source line CSL may be connected to a source of the ground selection transistor GST in common.

In an example, the upper selection transistor SST may be a string selection transistor, and the lower selection transistor GST may be a ground selection transistor.

Figure 3:
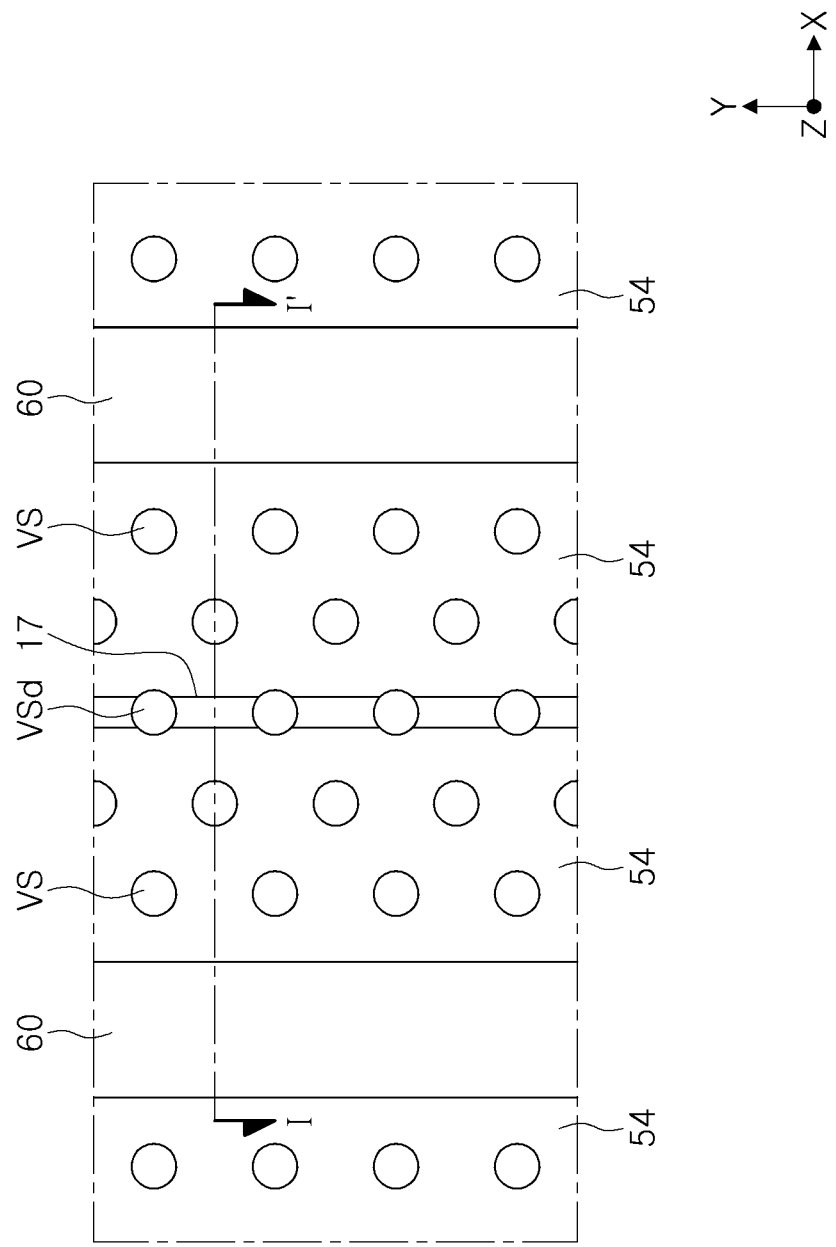
FIG. 3 is a plan view illustrating an example of the semiconductor device according to an example embodiment of the present inventive concept.
Figure 4:
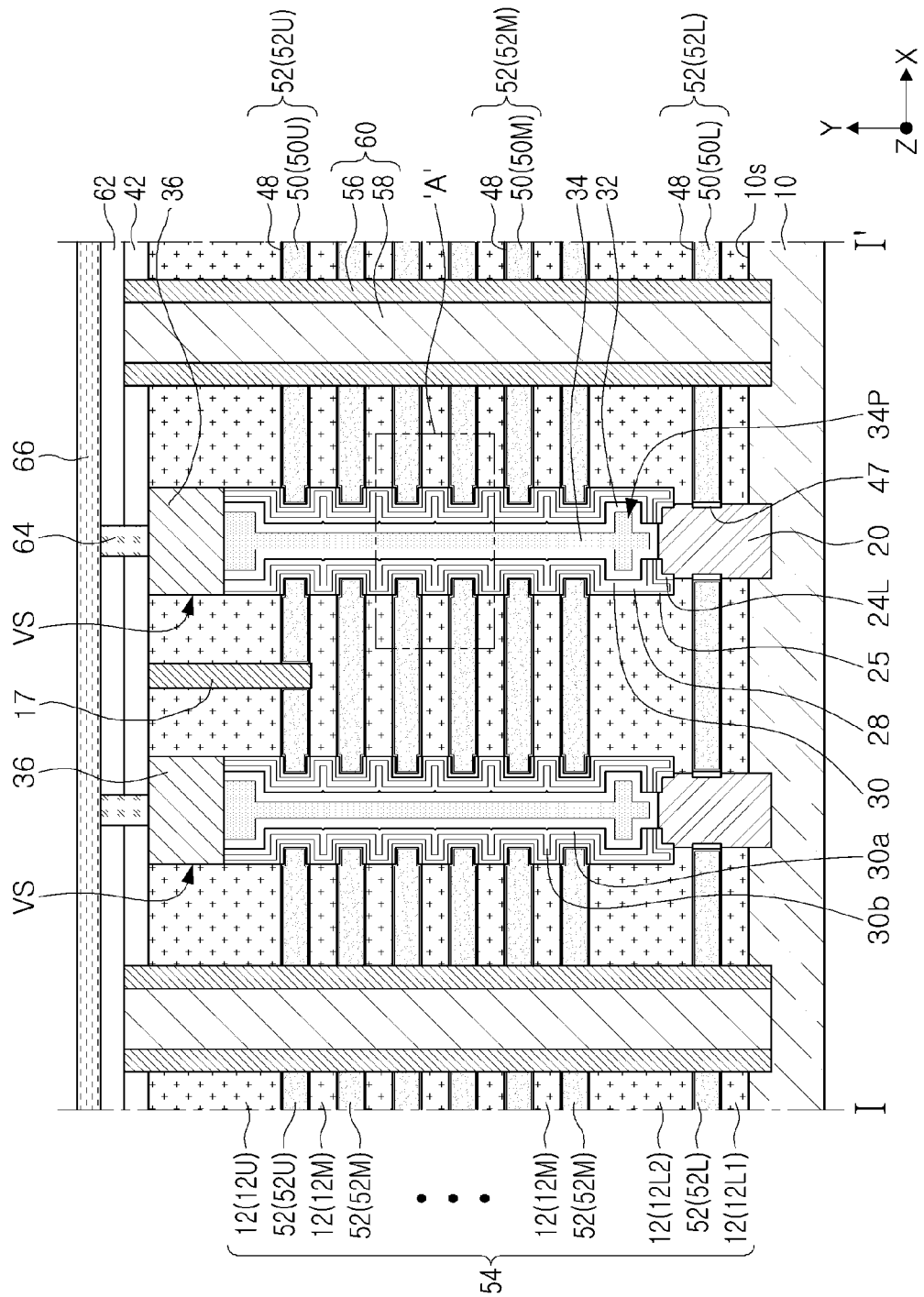
FIG. 4 is a cross-sectional view illustrating an example of the semiconductor device according to an example embodiment of the present inventive concept.
Figure 5:
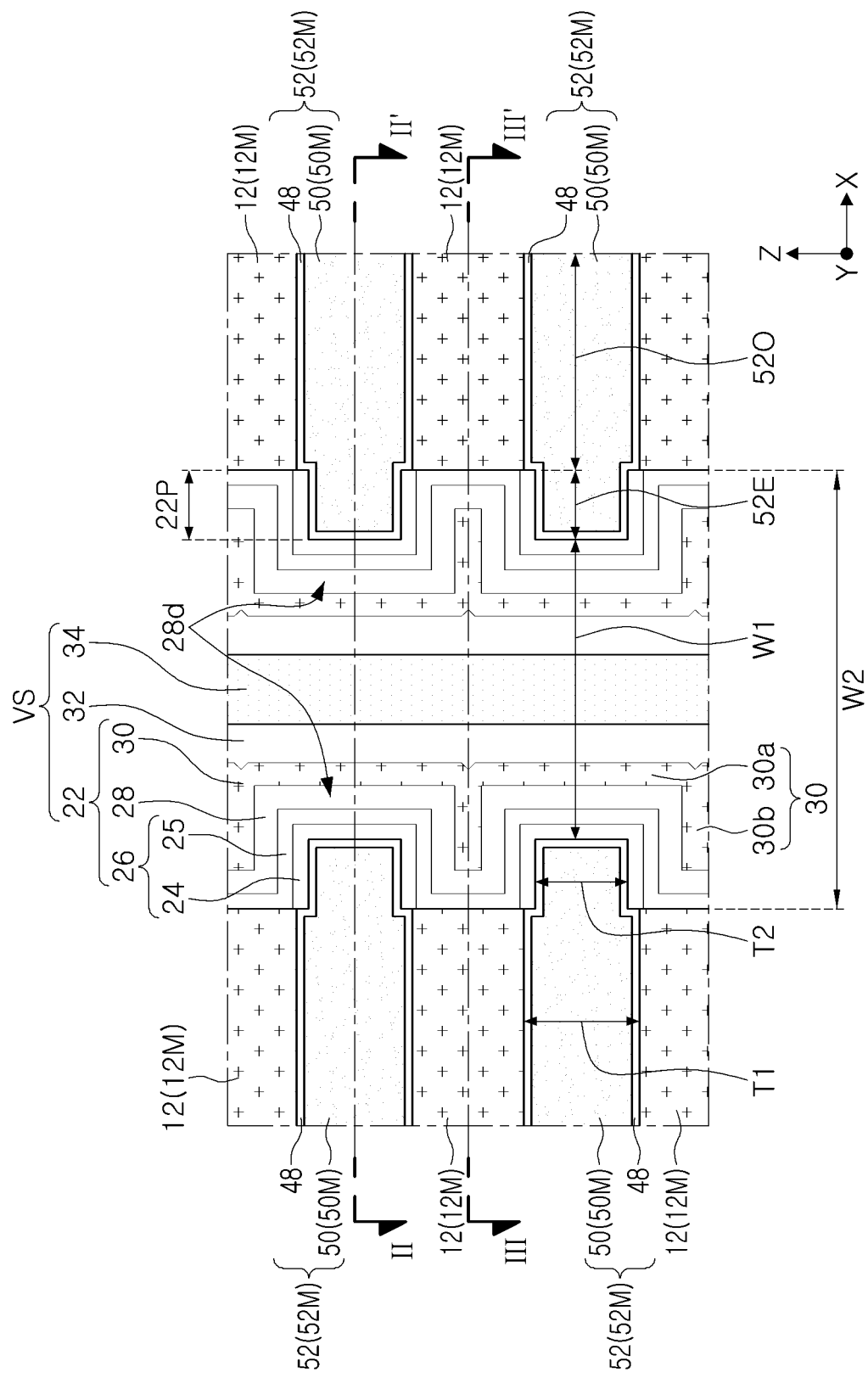
FIG. 5 is a partially enlarged view of portion "A" in FIG. 4.
Figure 6A:
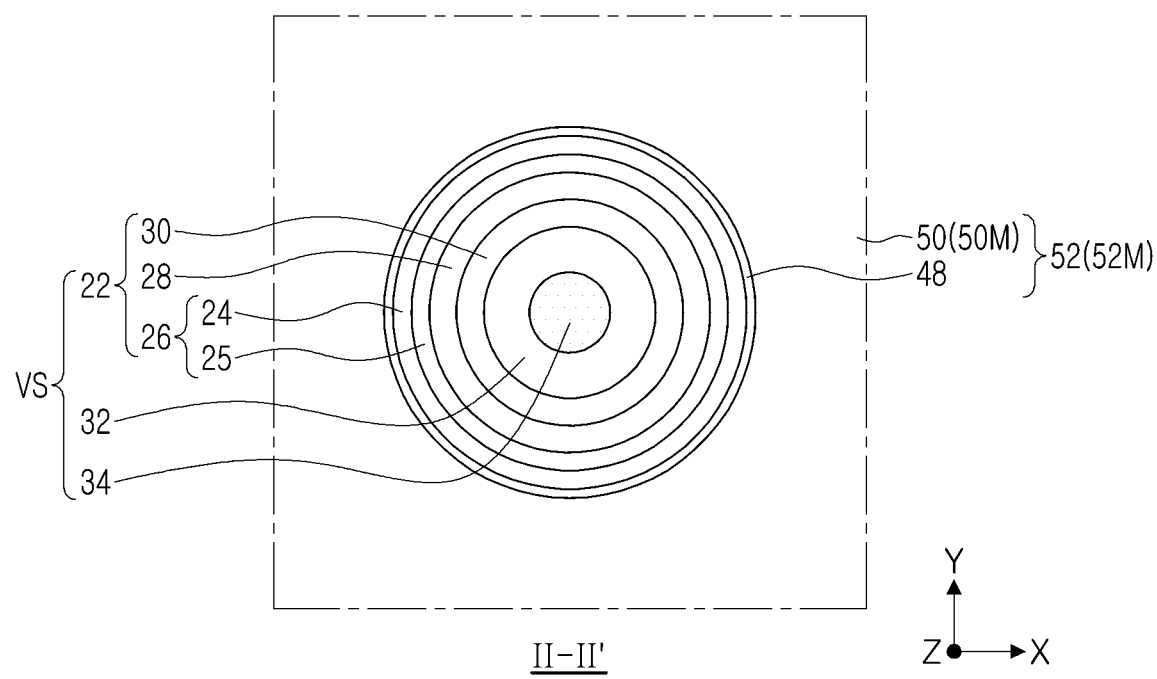
FIG. 6A is a plan view taken along line II-II' of FIG. 4.
Figure 6B:
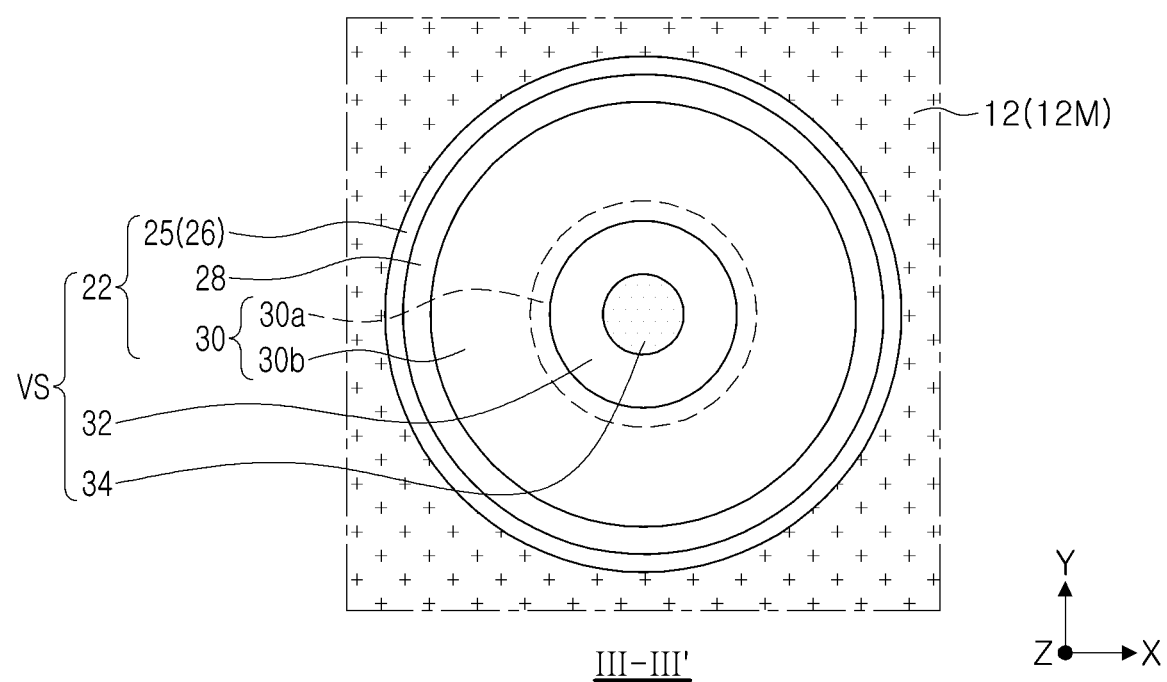
FIG. 6B is a plan view taken along line III-III' of FIG. 4.

Next, an example of a semiconductor device according to an example embodiment will be described with reference to FIGS. 3, 4, 5, 6A and 6B. In FIGS. 3 to 6B, FIG. 3 is a plan view illustrating an example of the semiconductor device according to an example embodiment, FIG. 4 is a cross-sectional view illustrating a region taken along line I-I' of FIG. 3, FIG. 5 is a partially enlarged view of portion "A" in FIG. 4, FIG. 6A is a plan view illustrating an X-Y plane taken along line II-II' of FIG. 5, and FIG. 6B is a plan view illustrating an X-Y plane taken along line III-III' of FIG. 5.

Referring to FIGS. 3, 4, 5, 6A and 6B, a stacked structure 54 may be disposed on a lower structure 10. For example, the lower structure 10 may include a substrate. The substrate may be a semiconductor substrate that may be formed of a semiconductor material such as silicon or the like. The lower structure 10 may include one of a semiconductor layer and a conductive layer or may include a semiconductor layer and a conductive layer.

The stacked structure 54 may include insulating layers 12 and gate patterns 52 alternately and repeatedly stacked. The gate patterns 52 may be stacked on the lower structure 10 while being spaced apart from each other in a vertical direction Z perpendicular to an upper surface 10s of the lower structure 10.

A first capping insulating layer 42 and a second capping insulating layer 62 may be sequentially stacked on the stacked structure 54. The first and second capping insulating layers 42 and 62 may be formed of silicon oxide.

Vertical memory structures VS may be disposed on the lower structure 10. The vertical memory structures VS may extend in the vertical direction Z and may penetrate through the stacked structure 54. The vertical memory structures VS may face the insulating layers 12 and the gate patterns 52. For example, sides of the vertical structures VS may face sides of the insulating layers 12 and the gate patterns 52.

In an example embodiment, vertical dummy structures VSd may be disposed on the lower structure 10. The vertical dummy structures VSd may have the same cross-sectional structure as that of the vertical memory structures VS.

Separation structures 60 may be disposed on the lower structure 10. The separation structures 60 may penetrate through the stacked structure 54 and the first capping insulation layer 42. The vertical memory structures VS may be disposed between the separation structures 60.

In an example, each of the separation structures 60 may include a separation pattern 58 and spacers 56 on sides of the separation pattern 58. The spacers 56 may be formed of an insulating material, for example, silicon oxide. The separation pattern 58 may be formed of a conductive material such as doped polysilicon, a metal nitride, a metal, or the like. In another example, the separation pattern 58 may be formed of an insulating material.

In an example, the gate patterns 52 may include a lower gate pattern 52L, an upper gate pattern 52U, and intermediate gate patterns 52M between the lower gate pattern 52L and the upper gate pattern 52U.

The insulating layers 12 may include a lowermost insulating layer 12L1 between the lower gate pattern 52L and the lower structure 10, a lower insulating layer 12L2 between the lower gate pattern 52L and the intermediate gate patterns 52M, interlayer insulating layers 12M interposed between the intermediate gate patterns 52M, and an upper insulating layer 12U on the upper gate pattern 52U.

An insulating pattern 17 may be disposed on the intermediate gate patterns 52M and may penetrate through the upper insulating layer 12U and the upper gate pattern 52U.

Conductive lines 66 may be disposed on the second capping insulating layer 62. In an example, the conductive lines 66 may be the bit lines (BL of FIG. 1 and FIG. 2) described above with reference to FIGS. 1 and 2.

Contact plugs 64 formed of a conductive material may be disposed to electrically connect the conductive lines 66 to the vertical memory structures VS. The contact plugs 64 may penetrate through the first and second capping insulating layers 42 and 62.

Each of the gate patterns 52 may include a first material layer 48 and a second material layer 50. The first material layer 48 may cover a side surface of the second material layer 50, facing the vertical memory structures VS and the vertical dummy structures 40d, while covering upper and lower surfaces of the second material layer 50. Thus, the first material layer 48 may be disposed between the second material layer 50 and the vertical memory structure VS, and may extend between the second material layer 50 and the interlayer insulating layers 12.

In an example, the first material layer 48 may be formed of a dielectric material, and the second material layer 50 may be formed of a conductive material. For example, the first material layer 48 may be formed of one or combination of a silicon oxide and a high-k dielectric material. In this case, the high-k dielectric material may be a dielectric having a dielectric constant greater than a dielectric constant of a silicon oxide such as aluminum oxide. The second material layer 50 may be formed of one of or a combination of two or more of doped silicon, a metal nitride such as TiN or the like, a metal such as titanium (Ti), tungsten (W) or the like, and a metal-semiconductor compound such as TiSi, WSi or the like.

In another example, the first and second material layers 48 and 50 may be formed of different conductive materials. For example, the first material layer 48 may be formed of a metal nitride, and the second material layer 50 may be formed of a metal.

In an example, when the first material layer 48 is formed of a dielectric material and the second material layer 50 is formed of a conductive material, the second material layers 50 of the gate patterns 52 may be gate electrodes 50L, 50M and 50U. Alternatively, for example, when the first and second material layers 48 and 50 are formed of different conductive materials, the gate patterns 52 may be gate electrodes.

Hereinafter, mainly an example in which the first material layer 48 may be formed of a dielectric material and the second material layer 50 may be formed of a conductive material will be described.

The second material layers 50 of the gate patterns 52 may be gate electrodes 50L, 50M and 50U. For example, the gate electrodes 50L, 50M and 50U may include a lower gate electrode 50L, intermediate gate electrodes 50M, and an upper gate electrode 50U. The lower gate pattern 52L may include the lower gate electrode 50L, the intermediate gate patterns 52M may include the intermediate gate electrodes 50M, and the upper gate pattern 52U may include the upper gate electrode 50U.

In an example, the lower gate electrode 50L may be the ground select line GSL described above with reference to FIGS. 1 and 2, the upper gate electrode 50U may be the string select line SSL described above with reference to FIGS. 1 and 2, and the intermediate gate electrodes 50M may be the word lines WL described above with reference to FIGS. 1 and 2.

Throughout the specification, the intermediate gate electrodes 50M, which may be the word lines WL described in FIGS. 1 and 2, may be referred to as 'cell gate electrodes.' Throughout the specification, the intermediate gate patterns 52M including the intermediate gate electrodes 50M, which may be the cell gate electrodes, may be referred to as 'cell gate patterns.'

Throughout the specification, the lower gate electrode 50L may be referred to as a 'lower select gate electrode,' a 'ground select gate electrode,' or a 'ground select line,' and the upper gate electrode 50U may be referred to as an 'upper select gate electrode,' a 'string selection gate electrode,' or a 'string select line.' The lower gate pattern 52L including the lower gate electrode 50L may be referred to as a 'lower select gate pattern,' and the upper gate pattern 52U including the upper gate electrode 50U may be referred to as an 'upper select gate pattern.'

Hereinafter, a description of the intermediate gate pattern 52M will be replaced with a description of a 'cell gate pattern.'

The cell gate patterns 52M may include overlapping portions 52O overlapping the interlayer insulating layers 12M, and extension portions 52E extending from the overlapping portions 52O in a horizontal direction X-Y. In this case, the horizontal direction X-Y may be a direction parallel to the upper surface 10s of the lower structure 10. The extension portions 52E may not overlap the interlayer insulating layers 12M. A thickness T1 of each of the overlapping portions 52O may be greater than a thickness T2 of each of the extension portions 52E.

In example embodiments, 'overlap' may mean overlapping in the vertical direction Z, perpendicular to the upper surface 10s of the lower structure 10. Thus, in example embodiments, 'overlap' may mean vertically overlapping.

The upper gate pattern 52U may include an overlapping portion 52O overlapping the interlayer insulating layers 12M and the upper insulating layer 12U (e.g., vertically overlapping), and an extension portion 52E extending from the overlapping portion 52O in the horizontal direction X-Y, in a manner similar to the respective cell gate patterns 52M. Since the upper gate pattern 52U has substantially the same structure as that of each of the cell gate patterns 52M, the structure of the upper gate pattern 52U may be understood from the structure of the cell gate patterns 52M. The overlapping portion 52O may also be described as a "gate pattern and insulation layer stack portion," since in a plan view it vertically overlaps with the gate pattern and insulation layer stack, and the extension portion 52E may also be described as a "vertical memory structure portion," since in a plan view it vertically overlaps with vertical memory structure VS.

Each of the vertical memory structures VS may include a dielectric structure 22, a channel semiconductor layer 32, a core pattern 34, and a pad pattern 36. Each of the vertical memory structures VS may further include a semiconductor pattern 20.

The semiconductor pattern 20 may penetrate through the lower gate pattern 52L and extend downwardly to penetrate through the lowermost insulating layer 12L1 to be connected to the lower structure 10, and may extend upwardly. The semiconductor pattern 20 may be located to be lower than the cell gate patterns 52M and may face the lower gate pattern 52L (e.g., side surfaces thereof may face each other). The semiconductor pattern 20 may be located in such a manner that an upper surface thereof is higher than an upper surface of the lower gate pattern 52L, and may be located to be lower than the cell gate patterns 52M.

An additional dielectric layer 47 may be disposed between the lower gate pattern 52L and the semiconductor pattern 20. The additional dielectric layer 47 may be formed of silicon oxide.

The core pattern 34 may be disposed on the semiconductor pattern 20 and may penetrate through the cell gate patterns 52M and the upper gate pattern 52U. The core pattern 34 may be formed of an insulating material, for example, silicon oxide.

The channel semiconductor layer 32 may be interposed between the core pattern 34 and the semiconductor pattern 20 and may extend on a side surface of the core pattern 34. The channel semiconductor layer 32 may cover an outer side surface of the core pattern 34. The channel semiconductor layer 32 may be formed, for example, of silicon.

The channel semiconductor layer 32 may extend in the vertical direction Z and penetrate through the cell gate patterns 52M and the upper gate pattern 52U.

The pad pattern 36 may be disposed on the channel semiconductor layer 32 and the core pattern 34. The pad pattern 36 may be located at a higher level than that of the upper gate pattern 52U. The pad pattern 36 may be formed of silicon having N-type conductivity, and may form a conductive pad.

The dielectric structure 22 may be disposed between the channel semiconductor layer 32 and the stacked structure 54. For example, the dielectric structure 22 may be interposed between the cell gate patterns 52M and the channel semiconductor layer 32, and may extend between the interlayer insulating layers 12M and the channel semiconductor layer 32. Further, the dielectric structure 22 may be further extended between the upper gate pattern 52U and the channel semiconductor layer 32 and between the upper insulating layer 12U and the channel semiconductor layer 32.

The dielectric structure 22 may cover a portion of an upper surface and a portion of an upper side surface of the semiconductor pattern 20. Thus, the dielectric structure 22 may extend from a portion thereof interposed between the cell gate patterns 52M and the channel semiconductor layer 32, to cover an upper edge of the semiconductor pattern 20.

Each of the vertical memory structures VS may have a first width W1 at a portion penetrating through the cell gate patterns 52M and the upper gate pattern 52U, and may have a second width W2 greater than the first width W1 in a portion penetrating through the interlayer insulating layers 12M and the upper insulating layer 12U. Furthermore, each of the vertical memory structures VS may be located at a level higher than the semiconductor pattern 20 and may have the second width W2 in a portion penetrating through the lower insulating layer 12L2.

The dielectric structure 22 may include protruding regions 22P extending between the extension portions 52E and overlapping the extension portions 52E (e.g., vertically overlapping from a plan view). The protruding regions 22P may face the interlayer insulating layers 12M.

The dielectric structure 22 may include a first dielectric layer 26, a data storage layer 28, and a second dielectric layer 30. The data storage layer 28 may be interposed between the first dielectric layer 26 and the second dielectric layer 30.

The second dielectric layer 30 may be disposed between the data storage layer 28 and the channel semiconductor layer 32. The first dielectric layer 26 may be disposed between the data storage layer 28 and the stacked structure 54.

The second dielectric layer 30 may be a tunnel dielectric layer. The second dielectric layer 30 may include silicon oxide and/or impurity-doped silicon oxide.

The first dielectric layer 26 may be a blocking dielectric layer. The first dielectric layer 26 may include first layers 24 and a second layer 25. The first layers 24 of the first dielectric layer 26 may be interposed between the extension portions 52E and the second layer 25. The first layers 24 may cover side, upper, and lower surfaces of the extension portions 52E. The second layer 25 may be interposed between the first layers 24 and the data storage layer 28 and may extend between the data storage layer 28 and the insulating layers 12. For example, the first layers 24 may cover the extension portions 52E of the cell gate patterns 52M and the upper gate pattern 52U. The second layer 25 may be interposed between the first layers 24 and the data storage layer 28, between the data storage layer 28 and the interlayer insulating layers 12M, between the data storage layer 28 and the upper insulating layer 12U, between the data storage layer 28 and the lower insulating layer 12L2, and between the data storage layer 28 and the semiconductor pattern 20. The dielectric structure 22 may further include a lower dielectric layer 24L interposed between the semiconductor pattern 20 and the data storage layer 28.

The first dielectric layer 26 may include a first portion disposed between the cell gate patterns 52M and the data storage layer 28, and a second portion disposed between the interlayer insulating layers 12M and the data storage layer 28. A thickness of the first portion of the first dielectric layer 26 (e.g. a thickness in a direction perpendicular to a surface of the gate pattern 52M that it faces) may be greater than a thickness of the second portion of the first dielectric layer 26 (e.g. a thickness in a direction perpendicular to a surface of the interlayer insulating layer 12M that it faces).

The lower dielectric layer 24L may be an oxidation layer formed by oxidizing the semiconductor pattern 20. For example, in the case in which the semiconductor pattern 20 is formed of silicon formed by an epitaxial growth process, the lower dielectric layer 24L may be an oxidation layer formed by oxidizing silicon. For example, the lower dielectric layer 24L may be an oxidation layer formed of a material including a silicon element and an oxygen element.

The first layers 24 may be oxidation layers formed by oxidizing silicon nitride. For example, the first layers 24 may be oxidation layers containing a silicon element, an oxygen element, and a nitrogen element. In another example, the first layers 24 may be oxidation layers formed by oxidizing polysilicon. For example, the first layers 24 may be oxidation layers formed of a material including a silicon element and an oxygen element. The second layer 25 may be a deposition layer formed by a deposition process such as chemical vapor deposition (CVD), atomic layer deposition (ALD) or the like. For example, the second layer 25 may be a deposition layer formed of silicon oxide.

The data storage layer 28 may be formed of a material capable of storing information. For example, the data storage layer 28 may be formed of silicon nitride.

The data storage layer 28 positioned between the channel semiconductor layer 32 and the intermediate gate patterns 52M may include data storage areas 28d capable of storing information. For example, depending on operating conditions of a nonvolatile memory device such as a flash memory device or the like, electrons injected into the data storage areas 28d of the data storage layer 28, from the channel semiconductor layer 32 facing the intermediate gate patterns 52M that may be word lines, through the second dielectric layer 30, may be trapped and retained, or the electrons trapped in the data storage layer 28 may be erased. Therefore, the data storage layer 28 may constitute the memory cells MCT described above with reference to FIG. 2.

The second dielectric layer 30 may include a first portion 30a in contact with the channel semiconductor layer 32 and a second portion 30b extending from the first portion 30a of the second dielectric layer 30 in the horizontal direction X-Y toward the insulating layers 12. As used herein, the term "contact" or "in contact with" refers to a direct connection (i.e., touching).

In example embodiments, the second portion 30b may be referred to as a 'protruding portion' or a 'horizontal protruding portion.'

At least a portion of the second portion 30b of the second dielectric layer 30 may overlap the extension portions 50E (e.g., vertically overlap, from a plan view). The data storage layer 28 may contact a side surface, an upper surface, and a lower surface of the second portion 30b of the second dielectric layer 30.

Thus, at least a portion of the data storage layer 28 may overlap the extension portions 50E (e.g., vertically overlap, from a plan view). Thus, the data storage layer 28 may extend from a portion thereof located between the intermediate gate patterns 52M and the channel semiconductor layer 32 to between the extension portions 50E, and thus vertically between two adjacent intermediate gate patterns 52M. For example, at particular heights above the lower structure 10 (such as shown in FIG. 6A), the data storage layer 28 extends vertically and is disposed horizontally between the channel semiconductor layer 32 and a horizontally adjacent intermediate gate pattern 52M without being vertically between two adjacent intermediate gate patterns 52M. At other heights above the lower structure 10 (e.g., which may include the height shown in FIG. 6B), the data storage layer 28 extends vertically or extends horizontally to be disposed horizontally between the channel semiconductor layer 32 and a horizontally adjacent insulation layer 12M, and is also disposed vertically between two adjacent intermediate gate patterns 52M. As described herein, an item, layer, or portion of an item or layer described as extending in a particular direction has a length in the particular direction and a width perpendicular to that direction, where the length is greater than the width.

As described above, the data storage areas 28d of the data storage layer 28 may trap and retain electrons, injected into the data storage areas of the data storage layer 28, from the channel semiconductor layer 32 facing the intermediate gate patterns 52M that may be word lines, through the second dielectric layer 30.

Figure 7:
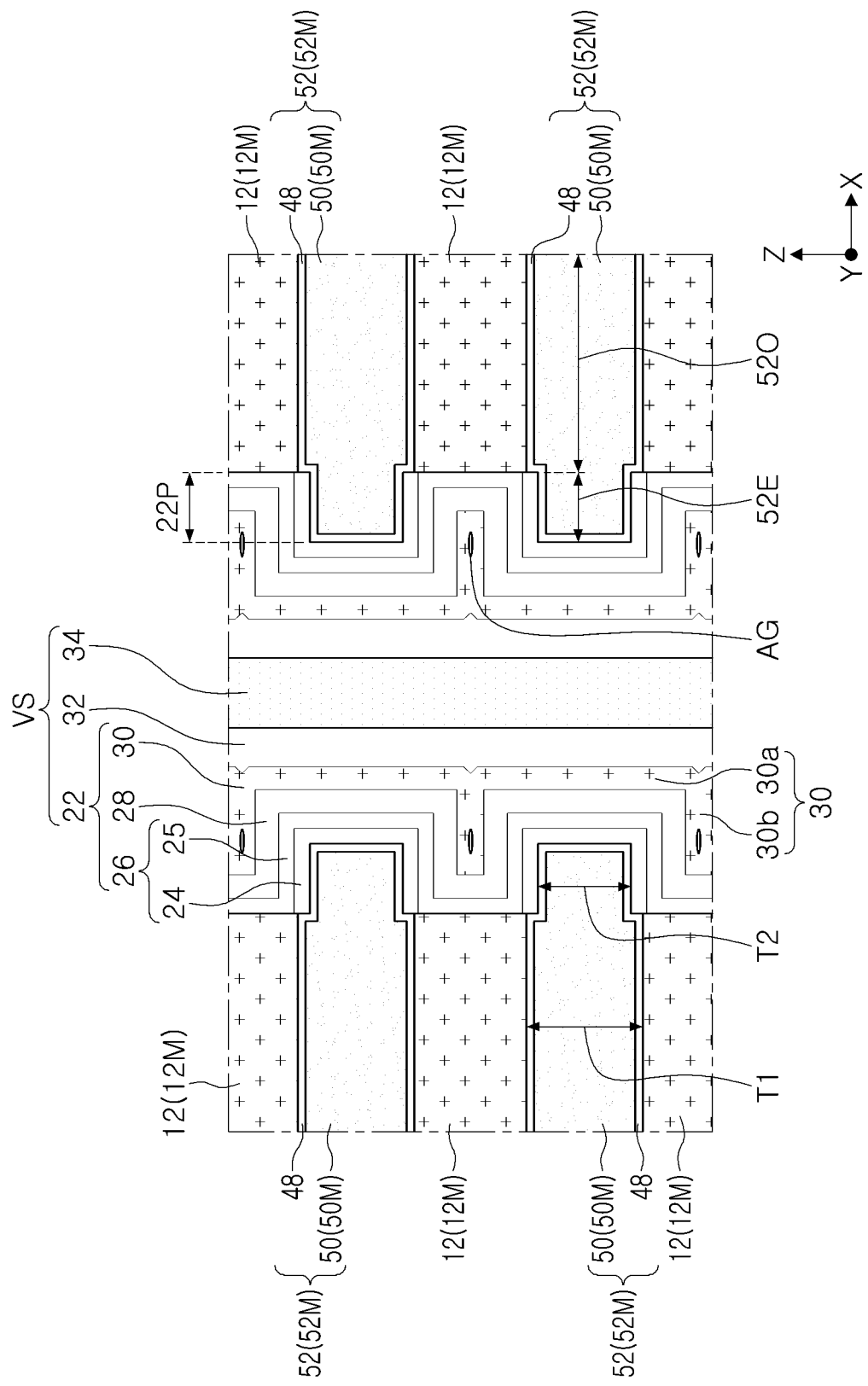
FIG. 7 is a partially enlarged cross-sectional view illustrating a modified example of the semiconductor device according to an example embodiment of the present inventive concept.

A modified example of the vertical memory structure VS will be described with reference to FIG. 7. FIG. 7 is a partial enlarged view corresponding to the partial enlarged view of FIG. 5.

Referring to FIG. 7 in a modified example, the dielectric structure 22 may further include an air gap AG disposed within the second portion 30b of the second dielectric layer 30. An "air gap" as discussed herein, may refer to atmospheric air, or other gases that may be present during the manufacturing process.

Figure 8:
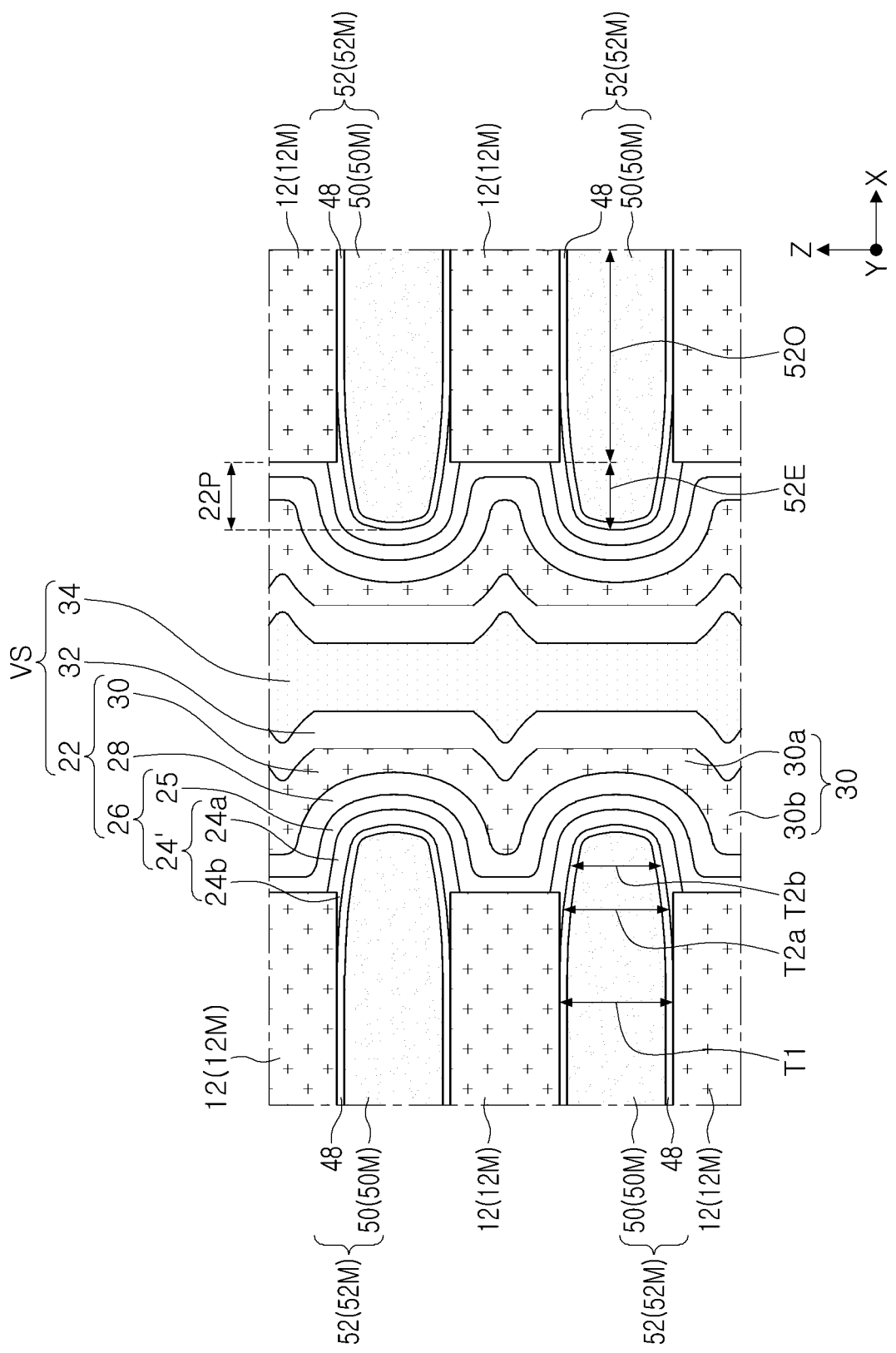
FIG. 8 is a partially enlarged cross-sectional view illustrating a modified example of the semiconductor device according to an example embodiment of the present inventive concept.

Modified examples of the gate patterns 52 and the first dielectric layer 26 will be described with reference to FIG. 8. FIG. 8 is a partial enlarged view corresponding to the partial enlarged view of FIG. 5.

Referring to FIG. 8, each of the cell gate patterns 52M may include a gradually narrower portion. For example, each of the cell gate patterns 52M may include an overlapping portion 52O overlapping the cell interlayer insulating layers 12M, and an extension portion 52E extending from the overlapping portion 52O in the horizontal direction X-Y, as described above. Each of the cell gate patterns 52M may gradually decrease in thickness from a portion of the overlapping portion 52O adjacent to the extension portion 52E to a side of the extension portion 52E. Thus, the overlapping portion 52O may include a portion having a first thickness T1 and a portion having a second thickness T2a less than the first thickness T1, and the extension portion 52E may have a third thickness T2b less than the second thickness T2a.

The first dielectric layer 26 may include first layers 24' including a first portion 24a and a second portion 24b. The first portion 24a of the first layers 24' may cover the side, upper and lower surfaces of the extension portion 52E, and the second portion 24b of the first layers 24' may be a portion extending from the first portion 24a to between the interlayer insulating layers 12M and the overlapping portion 52O.

Therefore, in the overlapping portion 52O, a portion thereof in contact with the cell interlayer insulating layers 12M may have the first thickness T1, and a portion thereof in contact with the second portion 24b of the first layers 24' may have a thickness T2a less than the first thickness T1. As shown in FIG. 8, some of the surfaces of different layers can have curved sides.

Figure 9:
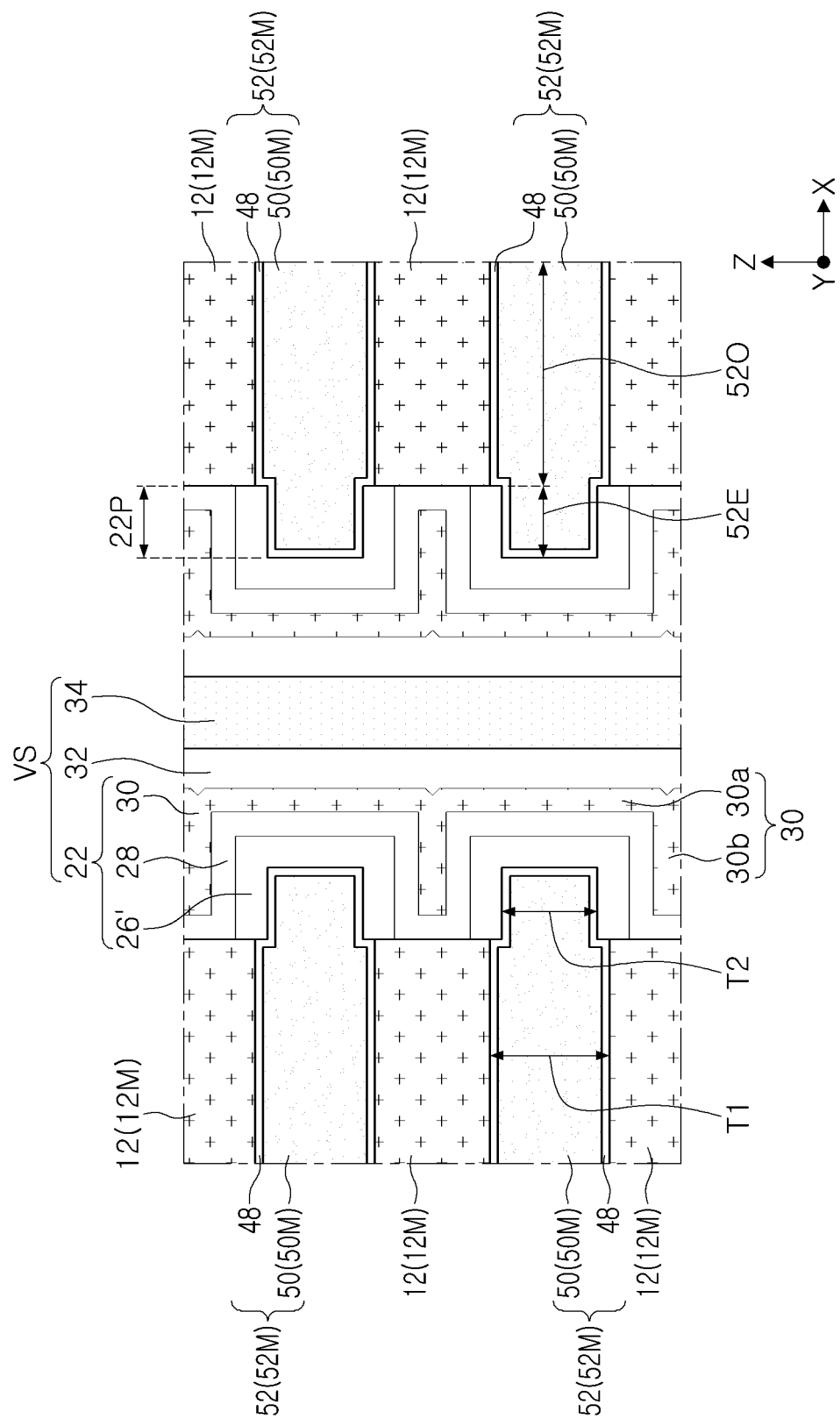
FIG. 9 is a partially enlarged cross-sectional view illustrating a modified example of the semiconductor device according to an example embodiment of the present inventive concept.

A modified example of the dielectric structure 22 will be described with reference to FIG. 9. FIG. 9 is a partial enlarged view corresponding to the partial enlarged view of FIG. 5.

Referring to FIG. 9, the dielectric structure 22 may include a modified first dielectric layer 26'. The first dielectric layer 26' may cover upper, lower and side surfaces of the extension portion 52E, and may be separated from a first dielectric layer 26' located at another vertical level. The first dielectric layer 26' may be formed, for example, of an oxidation layer.

The data storage layer 28 may be disposed between the first dielectric layer 26' and the second dielectric layer 30, and may be disposed between the second dielectric layer 30 and the interlayer insulating layers 12. The data storage layer 28 may be in contact with the cell interlayer insulating layers 12 and may separate the first dielectric layers 26' located at different height levels.

Referring again to FIGS. 3 to 6B, the core pattern 34 may include a protruding portion 34P extending horizontally, from a portion thereof facing the lower insulating layer 12L2 located at a higher level than the semiconductor pattern 20, toward the lower insulating layer 12L2. The channel semiconductor layer 32 may cover the side surface, the lower surface, and the upper surface of the protruding portion 34P of the core pattern 34.

Figure 10:
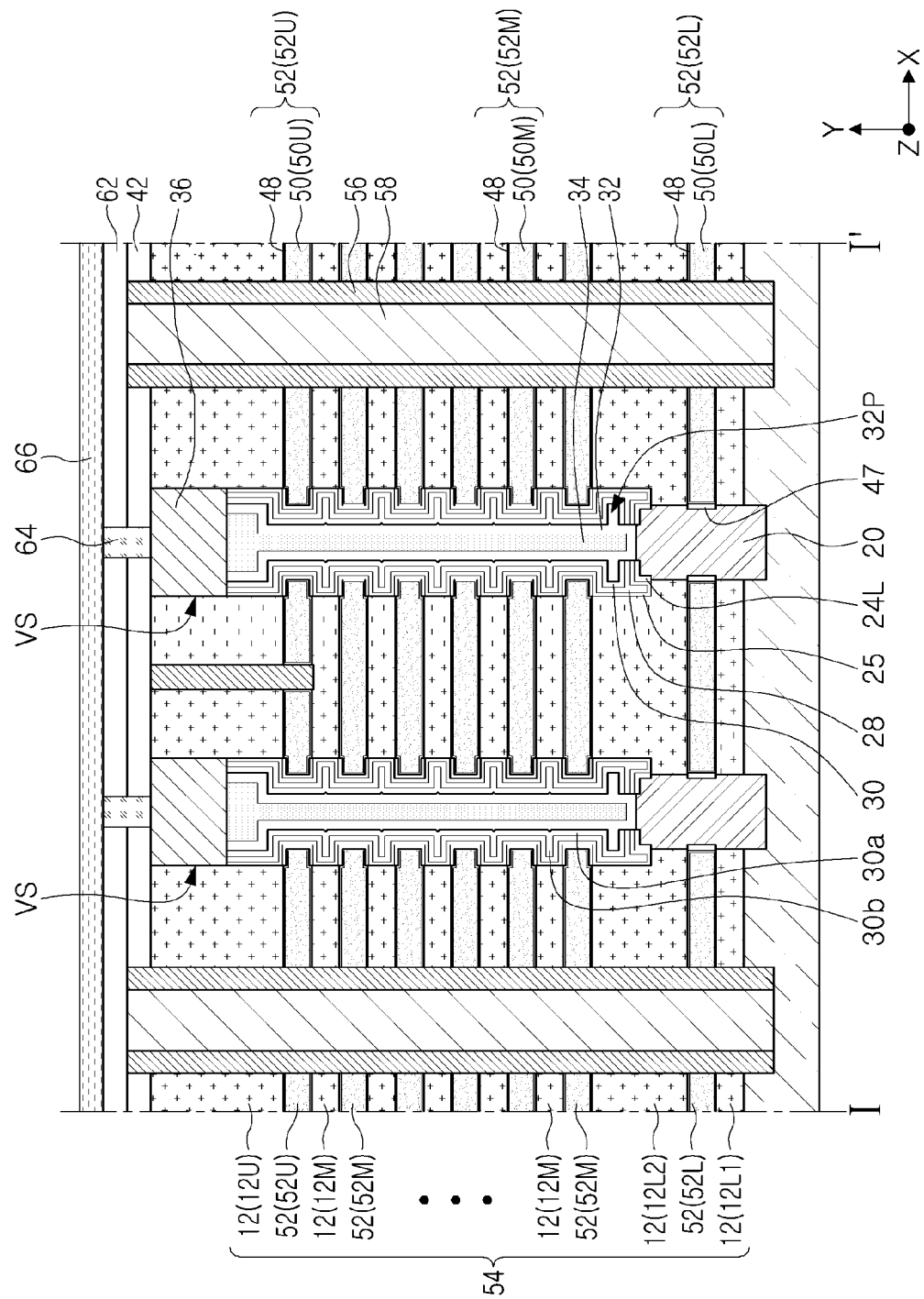
FIG. 10 is a cross-sectional view illustrating a modified example of the semiconductor device according to an example embodiment of the present inventive concept.

A modified example of the vertical memory structure VS will be described with reference to FIG. 10. FIG. 10 may be a cross-sectional view corresponding to the cross-sectional view of FIG. 4.

Referring to FIG. 10, the core pattern 34 of the vertical memory structure VS may be disposed on the semiconductor pattern 20 and may extend in the vertical direction Z. The channel semiconductor layer 32 of the vertical memory structure VS may be interposed between the core pattern 34 and the semiconductor pattern 20, and may extend on a side surface of the core pattern 34. The channel semiconductor layer 32 may include a protruding portion 32P extending from a portion thereof facing the lower insulating layer 12L2 located at a higher level than the semiconductor pattern 20 toward the lower insulating layer 12L2.

Figure 11:
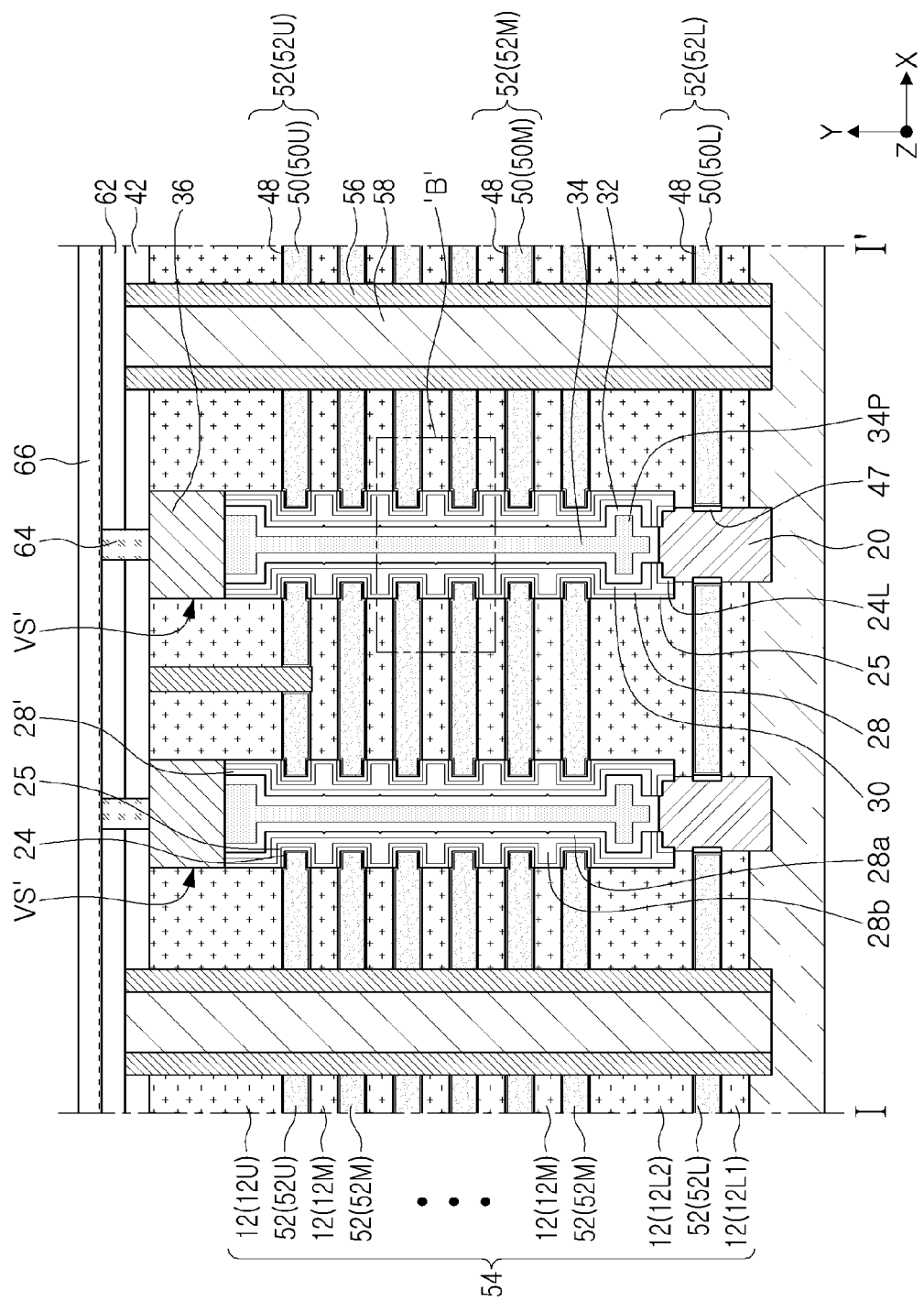
FIG. 11 is a cross-sectional view illustrating a modified example of the semiconductor device according to an example embodiment of the present inventive concept.
Figure 12:
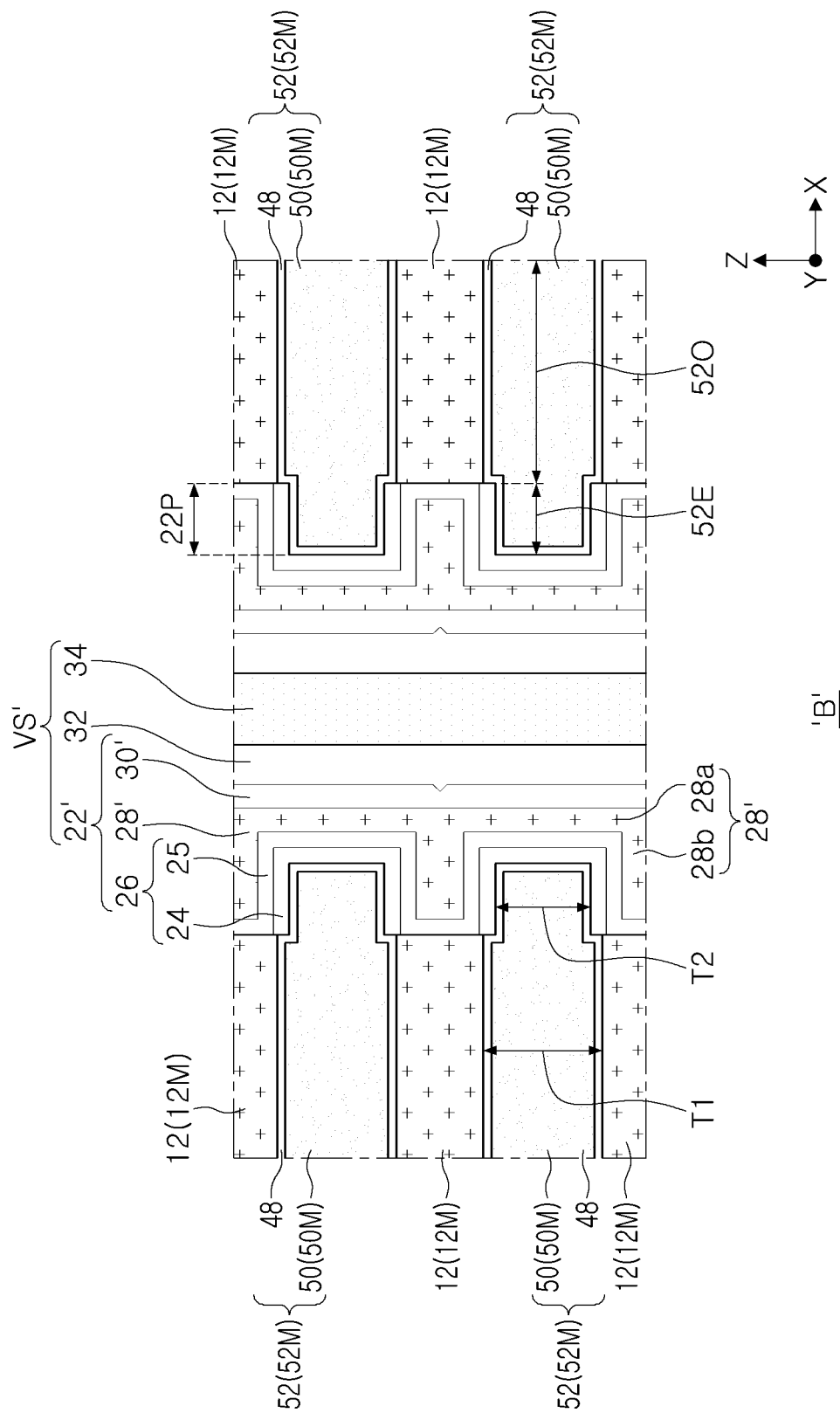
FIG. 12 is a partially enlarged view illustrating portion "B" in FIG. 11.

Referring to FIGS. 11 and 12, a modified example of the vertical memory structure VS described above will be described. FIG. 11 is a cross-sectional view illustrating an area taken along line I-I' of FIG. 3, and FIG. 12 is a partially enlarged view of a portion denoted by 'B' of FIG. 11. Hereinafter, only components to be modified, among the components described above with reference to FIGS. 3 to 6B, will be described, and the remaining components will be directly quoted in the description above with reference to FIGS. 3 to 6B or may be omitted.

In the modified example, referring to FIGS. 11 and 12, the stacked structure 54, the separation structure 60, and the conductive line 66, substantially the same as those described above in the foregoing embodiment, may be disposed on a lower structure 10.

Vertical memory structures VS' including a modified dielectric structure 22' may be disposed on the lower structure 10. The vertical memory structures VS' may include the channel semiconductor layer 32 and the core pattern 34, substantially the same as those described above.

The dielectric structure 22' may include the first dielectric layer 26 substantially the same as that described above. Thus, the first dielectric layer 26 may include the first layers 24 and the second layer 25, as described above.

The dielectric structure 22' may further include a data storage layer 28' and a second dielectric layer 30'. The data storage layer 28' may be disposed between the first dielectric layer 26 and the second dielectric layer 30'. The second dielectric layer 30' may be disposed between the data storage layer 28' and the channel semiconductor layer 32.

The second dielectric layer 30' may contact the channel semiconductor layer 32.

The data storage layer 28' may include a first portion 28a in contact with the second dielectric layer 30' and a second portion 28b extending from the first portion 28a in the horizontal direction X-Y. At least a portion of the second portion 28b of the data storage layer 28' may vertically overlap the extension portions 52E.

The second portion 28b of the data storage layer 28' may be referred to as a "protruding portion" or a "horizontal protruding portion".

Figure 13:
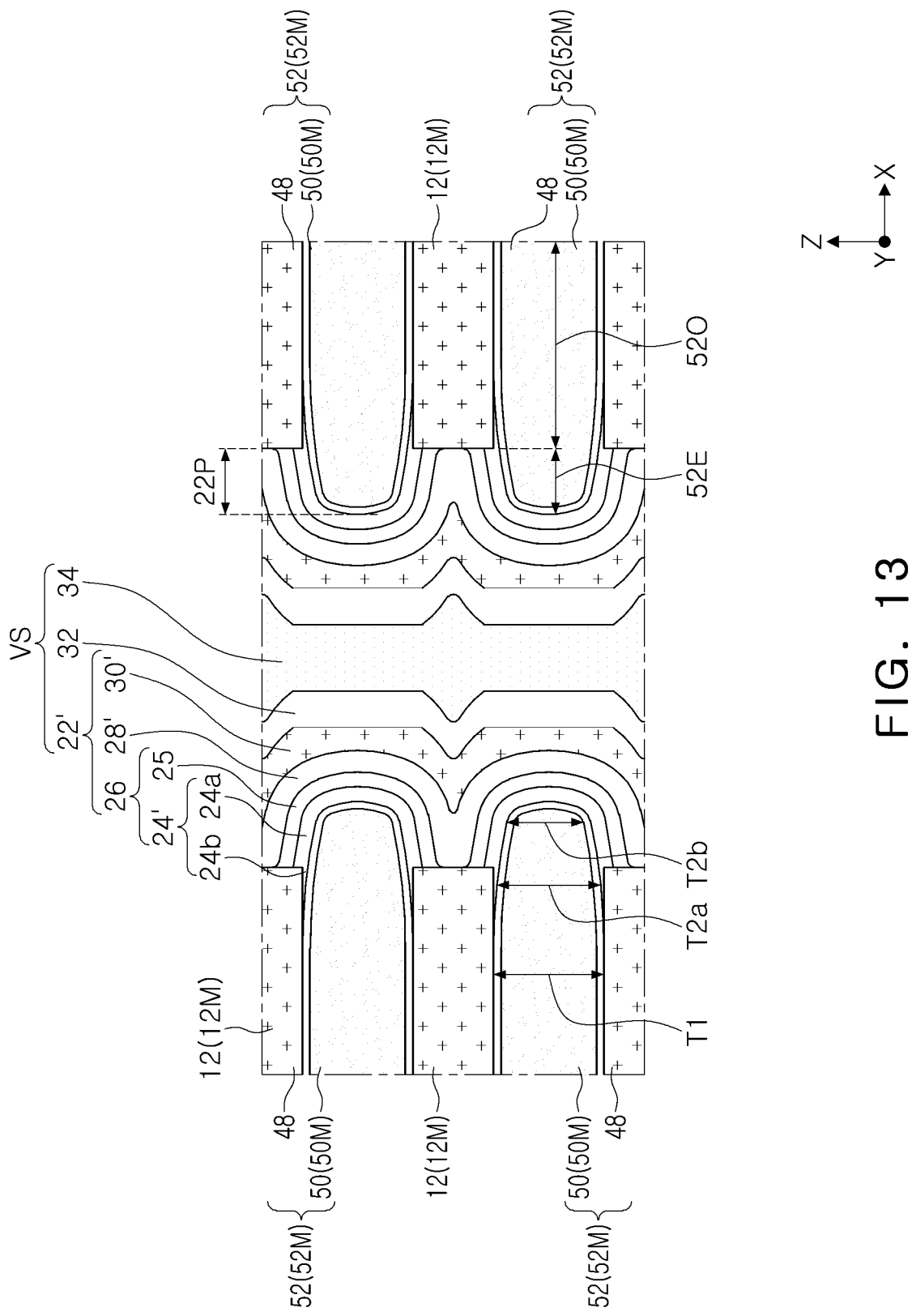
FIG. 13 is a partially enlarged cross-sectional view illustrating a modified example of the semiconductor device according to an example embodiment of the present inventive concept.

A modified example of the dielectric structure 22' will be described with reference to FIG. 13. FIG. 13 is a partial enlarged view corresponding to the partial enlarged view of FIG. 12.

Referring to FIG. 13, each of the cell gate patterns 52M may include an overlapping portion 52O overlapping the cell interlayer insulating layers 12M, and an extension portion 52E extending from the overlapping portion 52D in the horizontal direction X-Y, in a manner similar to the description above. Each of the cell gate patterns 52M may have a thickness gradually reduced from a portion of the overlapping portion 52O, adjacent to the extension portion 52E, to a side surface of the extension portion 52E, in the manner similar to the description above with reference to FIG. 8. Thus, the overlapping portion 52O may include a portion having a first thickness T1 and a portion having a second thickness T2$a$ less than the first thickness T1, and the extension portion 52E may have a third thickness T2$b$ less than the second thickness T2$a$.

The first dielectric layer 26 may include first layers 24' including a first portion 24$a$ and a second portion 24$b$. The first portion 24$a$ of the first layers 24' may cover side, upper and lower surfaces of the extension portion 52E, and the second portion 24$b$ of the first layers 24' may be a portion extending from the first portion 24$a$ to between the interlayer insulating layers 12M and the overlapping portion 52O. Therefore, in the overlapping portion 52O, a portion thereof in contact with the cell interlayer insulating layers 12M may have the first thickness T1, and a portion thereof in contact with the second portion 24$b$ of the first layers 24' may have the thickness T2$a$ less than the first thickness T1.

Figure 14:
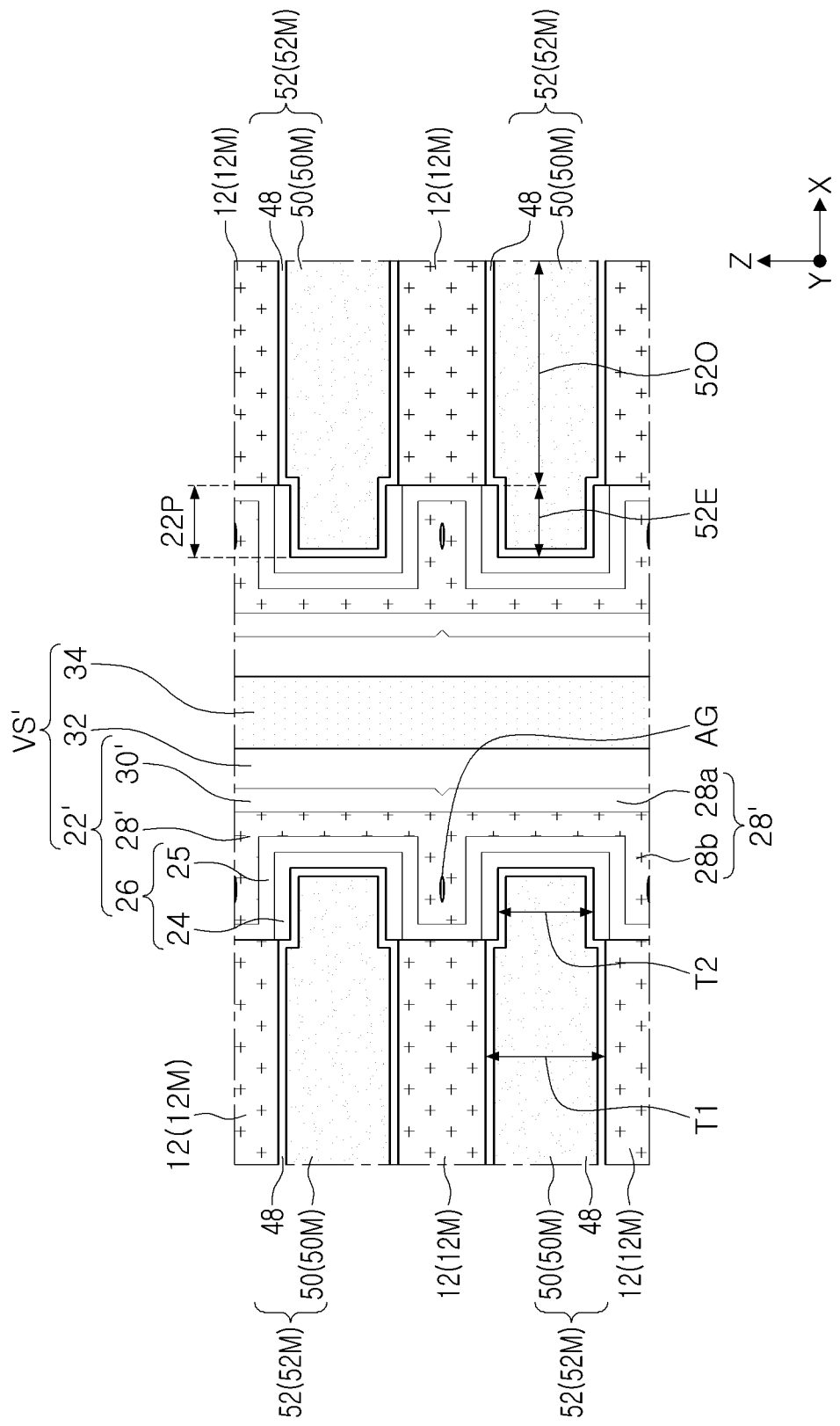
FIG. 14 is a partially enlarged cross-sectional view illustrating a modified example of the semiconductor device according to an example embodiment of the present inventive concept.

A modified example of the vertical memory structure VS will be described with reference to FIG. 14. FIG. 14 is a partial enlarged view corresponding to the partial enlarged view of FIG. 12.

In the modified example, referring to FIG. 14, the dielectric structure 22' may further include an air gap AG disposed in the second portion 28$b$ of the data storage layer 28'.

Figure 15:
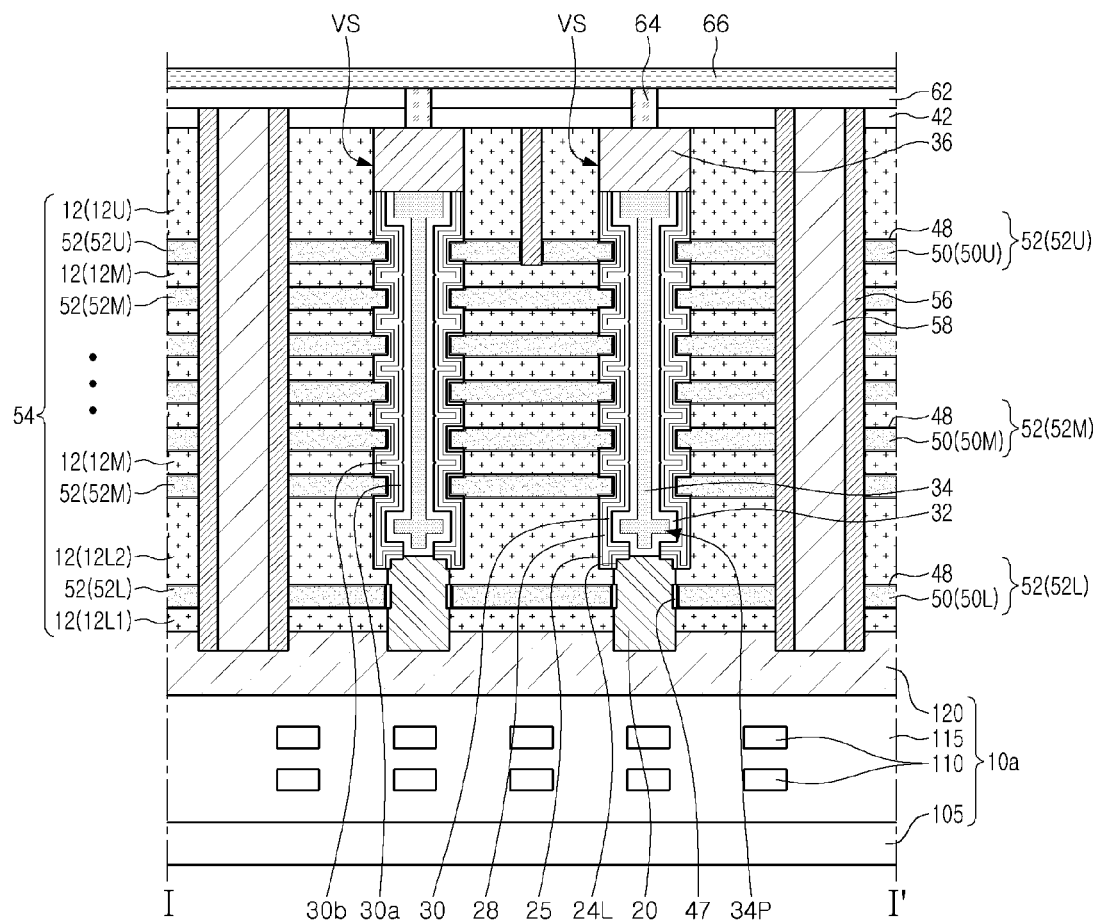
FIG. 15 is a cross-sectional view illustrating a modified example of the semiconductor device according to an example embodiment of the present inventive concept.

Next, a modified example of the above-described lower structure 10 described above will be described with reference to FIG. 15. FIG. 15 is a cross-sectional view illustrating an area taken along line I-I' in FIG. 3.

Referring to FIG. 15, a lower structure 10$a$ may include a first substrate 105, a second substrate 120 on the first substrate 105, and peripheral circuit structures 110 and 115 between the first substrate 105 and the second substrate 120.

In an example, the first substrate 105 may include a monocrystalline silicon substrate.

In an example, the second substrate 120 may include a polysilicon substrate. Alternatively, the second substrate 120 may be a substrate including a polysilicon layer and a metal layer.

In an example, the peripheral circuit structures 110 and 115 may include peripheral circuit interconnection 110 and a peripheral insulating layer 115 covering the peripheral circuit interconnection 110.

The stacked structure 54, the vertical memory structures VS, the separation structures 60, and the conductive line 66 as described above with reference to FIGS. 3 to 6B or the alternative embodiments discussed above may be disposed on the lower structure 10$a$.

Figure 16:
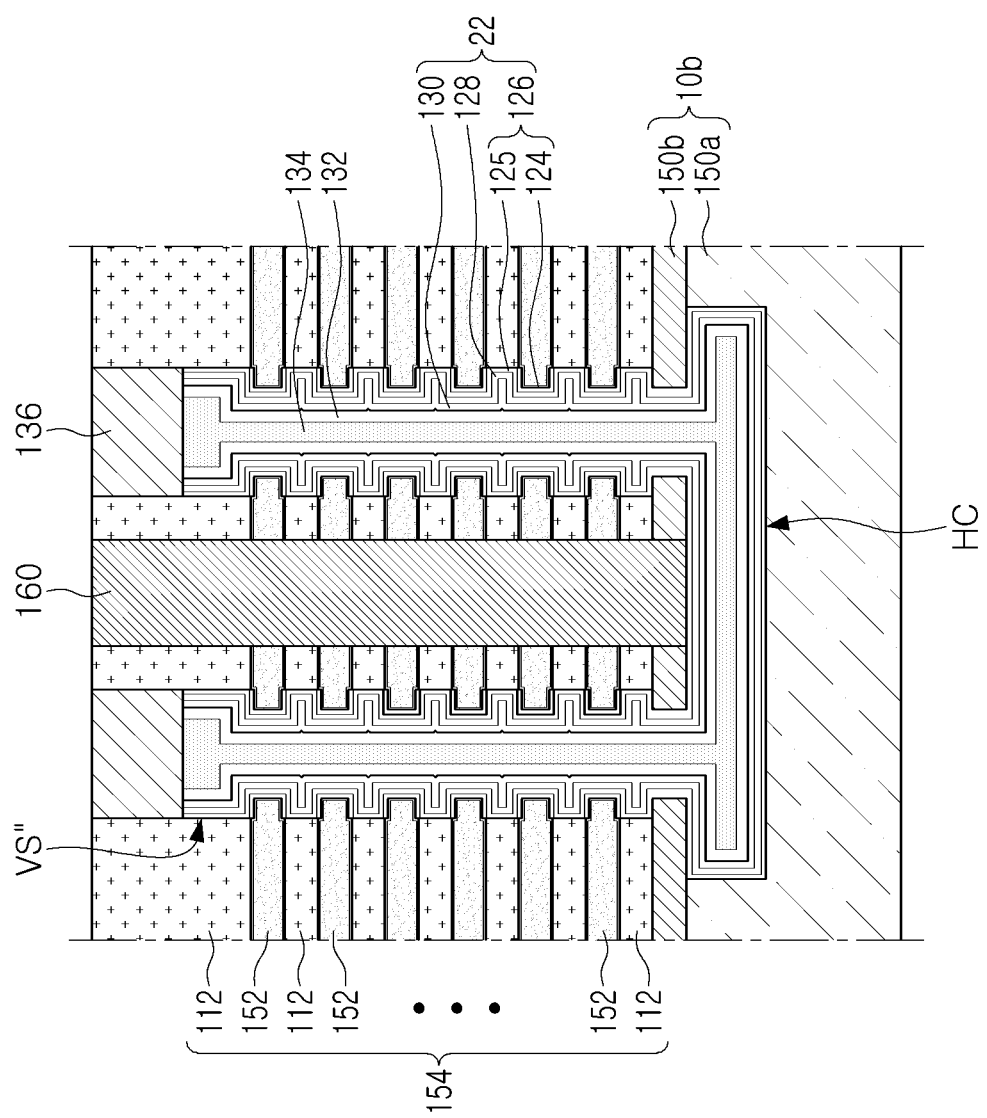
FIG. 16 is a cross-sectional view illustrating a modified example of the semiconductor device according to an example embodiment of the present inventive concept.

Next, a modified example of the semiconductor device according to an example embodiment will be described with reference to FIG. 16. FIG. 16 is a cross-sectional view schematically illustrating a modified example of the semiconductor device according to an example embodiment.

Referring to FIG. 16, a stacked structure 154 may be disposed on a lower structure 10$b$. The stacked structure 154 may include interlayer insulating layers 112 and gate patterns 152 alternately and repeatedly stacked on the lower structure 10$b$. The gate patterns 152 may be substantially the same as the gate patterns 52 described above. The interlayer insulating layers 112 may be formed of silicon oxide.

The separation structure 160 may be disposed to penetrate through the stacked structure 154 on the lower structure 10$b$. The separation structure 160 may be formed of an insulating material such as silicon oxide.

Vertical memory structures VS" may be disposed to penetrate through the stacked structure 154. The vertical memory structures VS" may be formed to have substantially the same structure as and formed of the same material as those in a portion of the vertical memory structure VS, penetrating through the cell gate patterns 52M, the cell interlayer insulating layers 12M, the upper gate pattern 52U and the upper insulating layer 12U, described in any of the various embodiments above. Thus, the vertical memory structures VS" may include the dielectric structure 22, the channel semiconductor layer 132, the core pattern 134 and the pad pattern 136, substantially the same as those described above. The dielectric structure 22 may include a first dielectric layer 126, a data storage layer 128, and a second dielectric layer 130. The first dielectric layer 126, the data storage layer 128 and the second dielectric layer 130 may correspond to the first dielectric layer 26, the data storage layer 28 and the second dielectric layer 30 described above with reference to FIGS. 3 to 14, respectively. The first dielectric layer 126 may include first layers 24 and a second layer 25 corresponding to the first layers 24 and the second layer 25 described above with reference to FIGS. 3 to 14, respectively.

The vertical memory structures VS" may further include a connecting portion HC extending from lower regions of the vertical memory structures VS" into the lower structure 10$b$, to connect the vertical memory structures VS" to each other. The connecting portion HC may be formed by extending the core pattern 134, the channel semiconductor layer 132, and the dielectric structure 22 of the vertical memory structures VS". The connecting portion HC may be disposed below the separation structure 160.

The lower structure 10$b$ may include a first lower layer 150$a$ and a second lower layer 150$b$ on the first lower layer 150$a$. The first and second lower layers 150$a$ and 150$b$ may be formed of doped silicon.

Next, a method of forming a semiconductor device according to an example embodiment will be described with reference to FIGS. 17 to 22. FIGS. 17 to 22 are cross-sectional views illustrating regions taken along line I-I' in FIG. 3.

Figure 17:
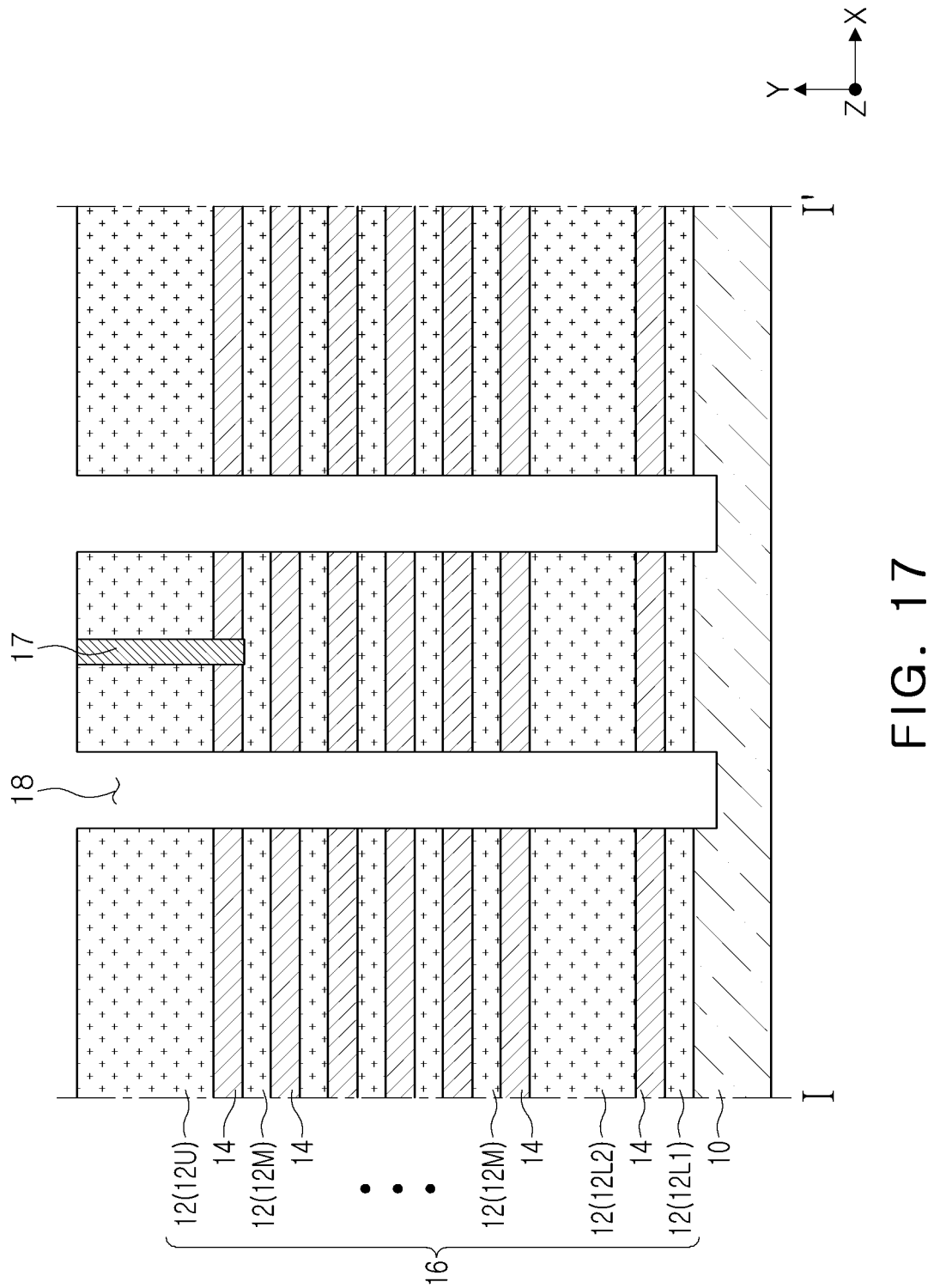
FIGS. 17 to 22 are cross-sectional views illustrating a method of forming a semiconductor device according to an example embodiment of the present inventive concept.

Referring to FIGS. 3 and 17, a mold structure 16 may be formed on a lower structure 10. The lower structure 10 may include a semiconductor substrate. The mold structure 16 may include insulating layers 12 and sacrificial gate patterns 14 alternately and repeatedly stacked.

The insulating layers 12 may include a lowermost insulating layer 12L1, a lower insulating layer 12L2 on the lowermost insulating layer 12L1, and an uppermost insulating layer 12U.

The insulating layers 12 may be formed of silicon oxide, and the sacrificial gate patterns 14 may be formed of a material having etching selectivity with respect to the insulating layers 12. For example, the sacrificial gate patterns 14 may be formed of silicon nitride. Alternatively, the sacrificial gate patterns 14 may be formed of polysilicon.

An insulating pattern 17 may be formed to penetrate through the uppermost insulating layer 12U and a sacrificial gate pattern 14 below the uppermost insulating layer 12U. The insulating pattern 17 may be formed of silicon oxide.

Holes 18 may be formed to penetrate through the stacked structure 16. Some of the holes 18 may penetrate through the insulating pattern 17. The holes 18 may expose the lower structure 10.

Figure 18:
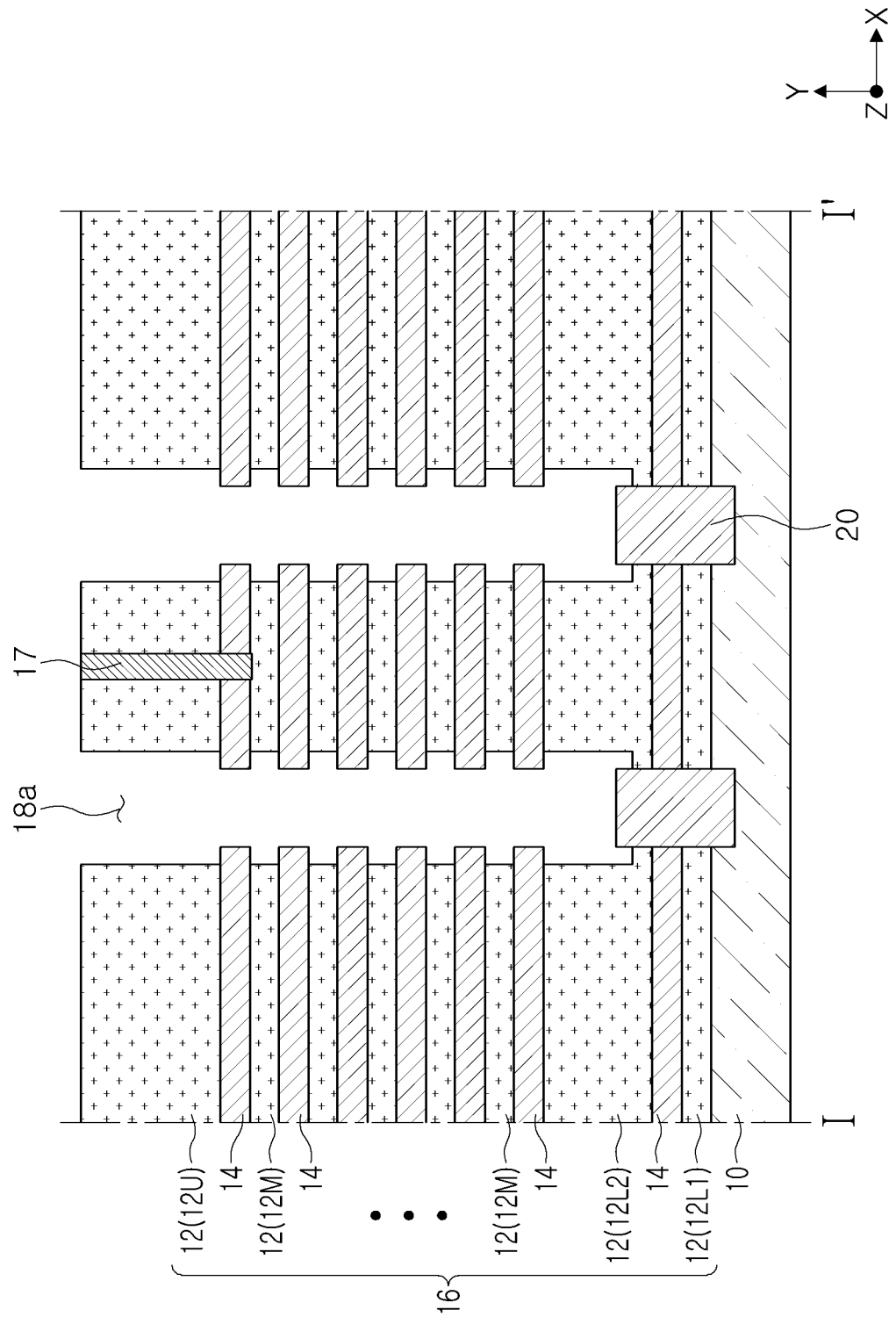

Referring to FIGS. 3 and 18, an epitaxial growth process may be performed to form epitaxially-grown semiconductor patterns 20 from the lower structure 10 exposed by the holes 18.

The insulating layers 12 may be partially etched. For example, the holes (18 in FIG. 17) may be formed as extended holes 18*a* by partially etching the insulating layers 12 by an isotropic etching process. The sacrificial gate patterns 14 may be formed to further protrude rather than the insulating layers 12 by the extended holes 18*a*. Thus, the sacrificial gate patterns 14 may have protruding portions of which side, upper, and lower surfaces are exposed by the extended holes 18*a*.

Figure 19:
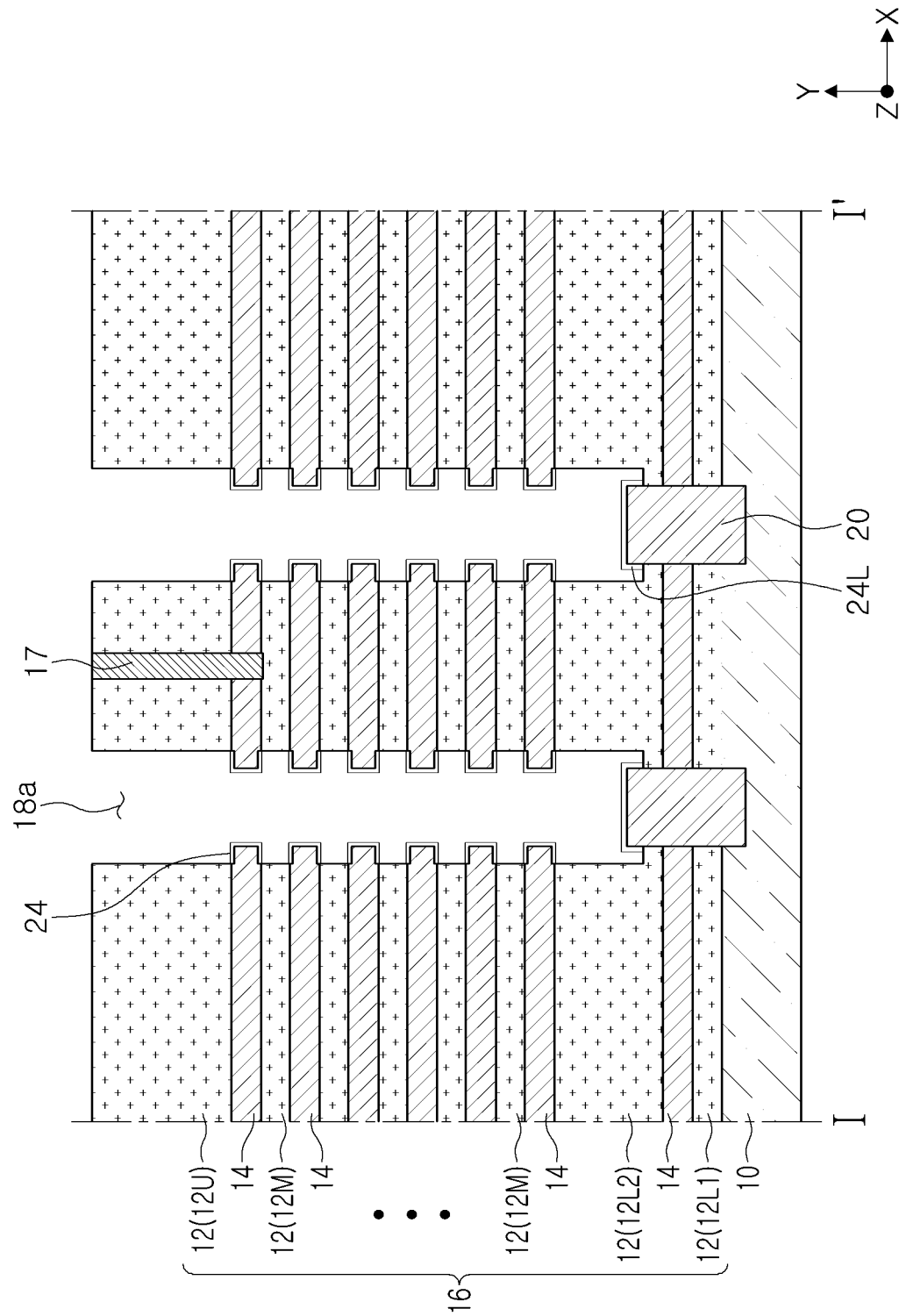

Referring to FIGS. 3 and 19, an oxidation process may be performed to oxidize the protruding portions of the sacrificial gate patterns 14 exposed by the extended holes 18*a*, to form oxidation layers 24, and further, the semiconductor pattern 20 exposed by the extended holes 18*a* may be oxidized to form a lower dielectric layer 24L.

A material of the oxidation layers 24 may be determined depending on a material of the sacrificial gate patterns 14. For example, when the sacrificial gate patterns 14 are formed of silicon nitride, the oxidation layers 24 may be oxidation layers formed by oxidizing silicon nitride. For example, the oxidation layers 24 may be formed of a material including a silicon element, an oxygen element, and a nitrogen element. In another example, the oxidation layers 24 may be material layers formed by oxidizing polysilicon. For example, the oxidation layers 24 may be formed of a material including a silicon element and an oxygen element.

In a case in which the semiconductor pattern 20 is formed of silicon formed by an epitaxial growth process, the lower dielectric layer 24L may be formed of a material including a silicon element and an oxygen element.

In example embodiments, the size of the protruding portions of the sacrificial gate patterns 14 may be reduced while the oxidation layers 24 are formed. For example, the protruding portions of the sacrificial gate patterns 14 may be reduced in thickness while being oxidized. Thus, the protruding portions of the sacrificial gate patterns 14 may have a thickness less than that of portions of the sacrificial gate patterns 14 overlapping the insulating layers 12.

Figure 20:
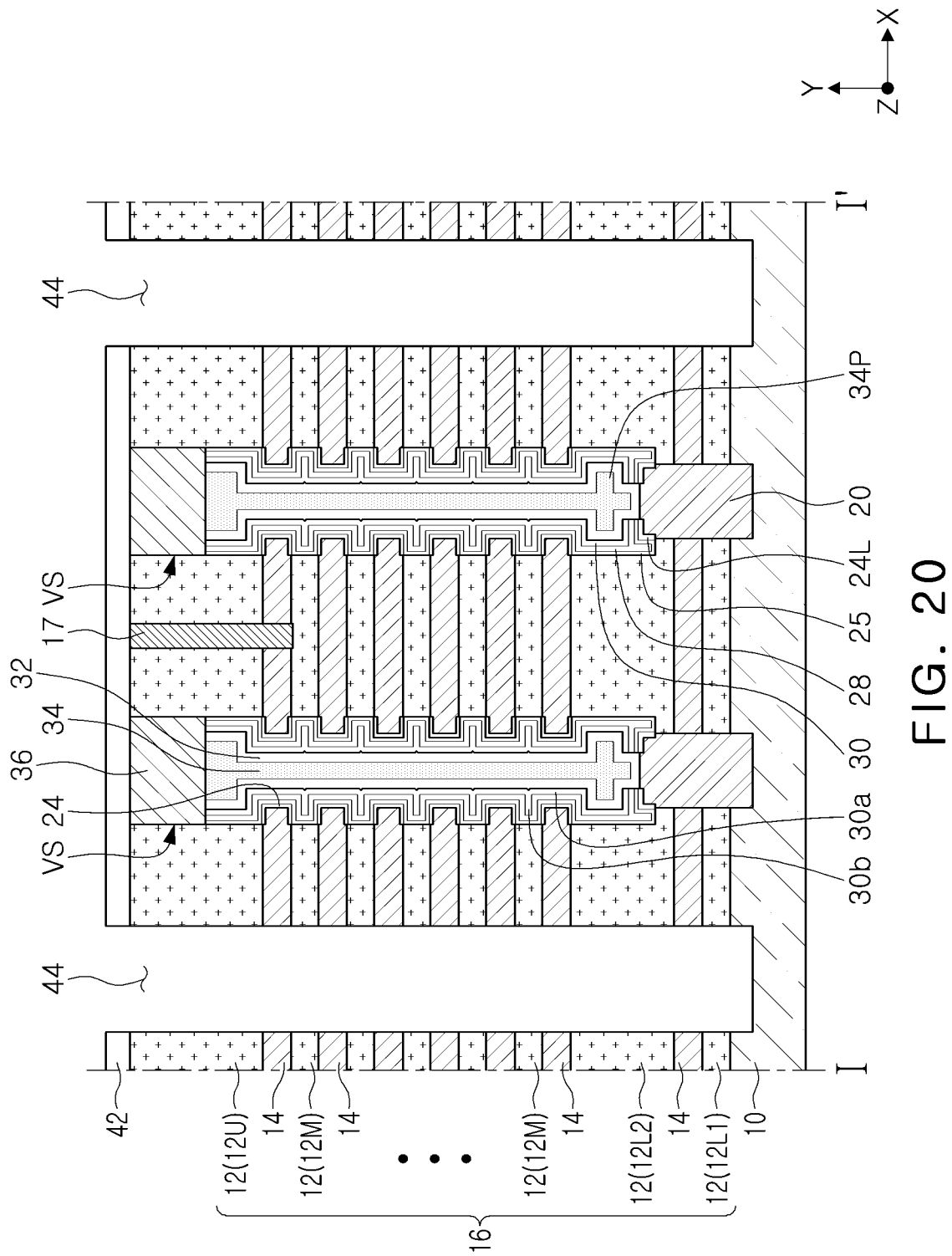

Referring to FIGS. 3 and 20, a deposition layer 25, a data storage layer 28, and a second dielectric layer 30 are sequentially formed on the lower structure 10 on which the lower dielectric layer 24L and the oxidation layers 24 are formed. In addition, a portion of an upper surface of the semiconductor pattern 20 may be exposed by patterning the lower dielectric layer 24L, the deposition layer 25, the data storage layer 28 and the second dielectric layer 30, sequentially formed on an upper surface of the semiconductor pattern 20. The deposition layer 25, the data storage layer 28, and the second dielectric layer 30 may remain on a sidewall of the extended hole (18*a* in FIG. 19). Then, a channel semiconductor layer 32 may be formed to cover an inner wall of the extended hole (18*a* in FIG. 19), and a core pattern 34 may be formed to fill the extended hole (18*a* in FIG. 19). After the channel semiconductor layer 32 and the core pattern 34 are partially etched, a pad pattern 36 is formed in an upper region of the extended hole 18*a* (see FIG. 19). The oxidation layers 24 and the deposition layer 25 may constitute the first dielectric layer (26 in FIG. 5) described above.

Therefore, the vertical memory structures VS as described above with reference to FIG. 4 are formed in the extended hole (18*a* in FIG. 19).

Subsequently, a first capping insulating layer 42 may be formed to cover the mold structure 16 and the vertical memory structures VS.

Separation trenches 44 may be formed to penetrate through the first capping insulating layer 42 and the mold structure 16, to expose the lower structure 10. The separation trenches 44 may expose the sacrificial gate patterns 14 of the mold structure 16.

Figure 21:
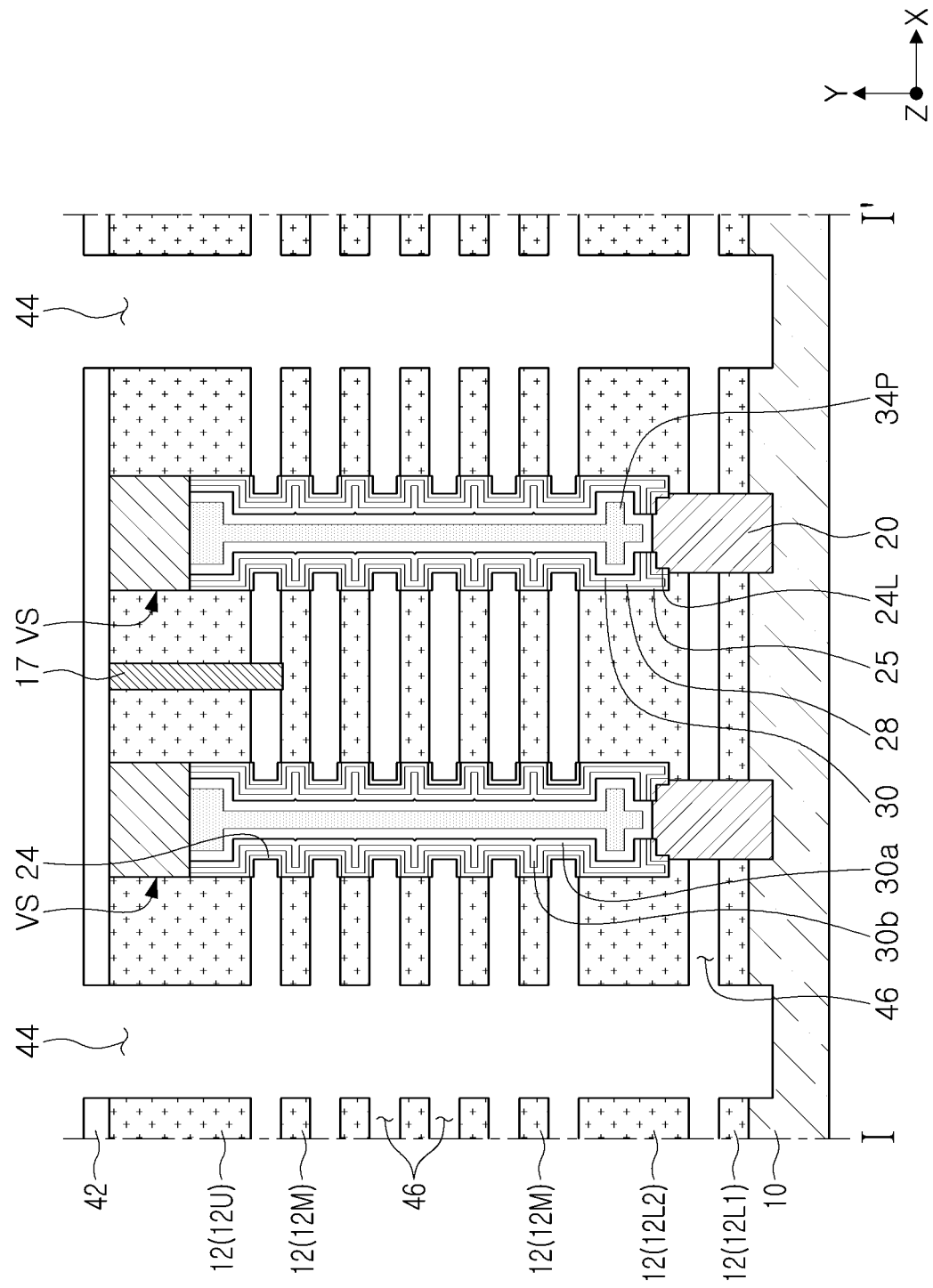

Referring to FIGS. 3 and 21, the sacrificial gate patterns 14 may be selectively removed to form empty spaces 46 between the insulating layers 12. The empty spaces 46 expose the oxidation layers 24 of the vertical memory structure VS. In addition, the empty spaces 46 may expose portions of side surfaces of the semiconductor pattern 20.

Figure 22:
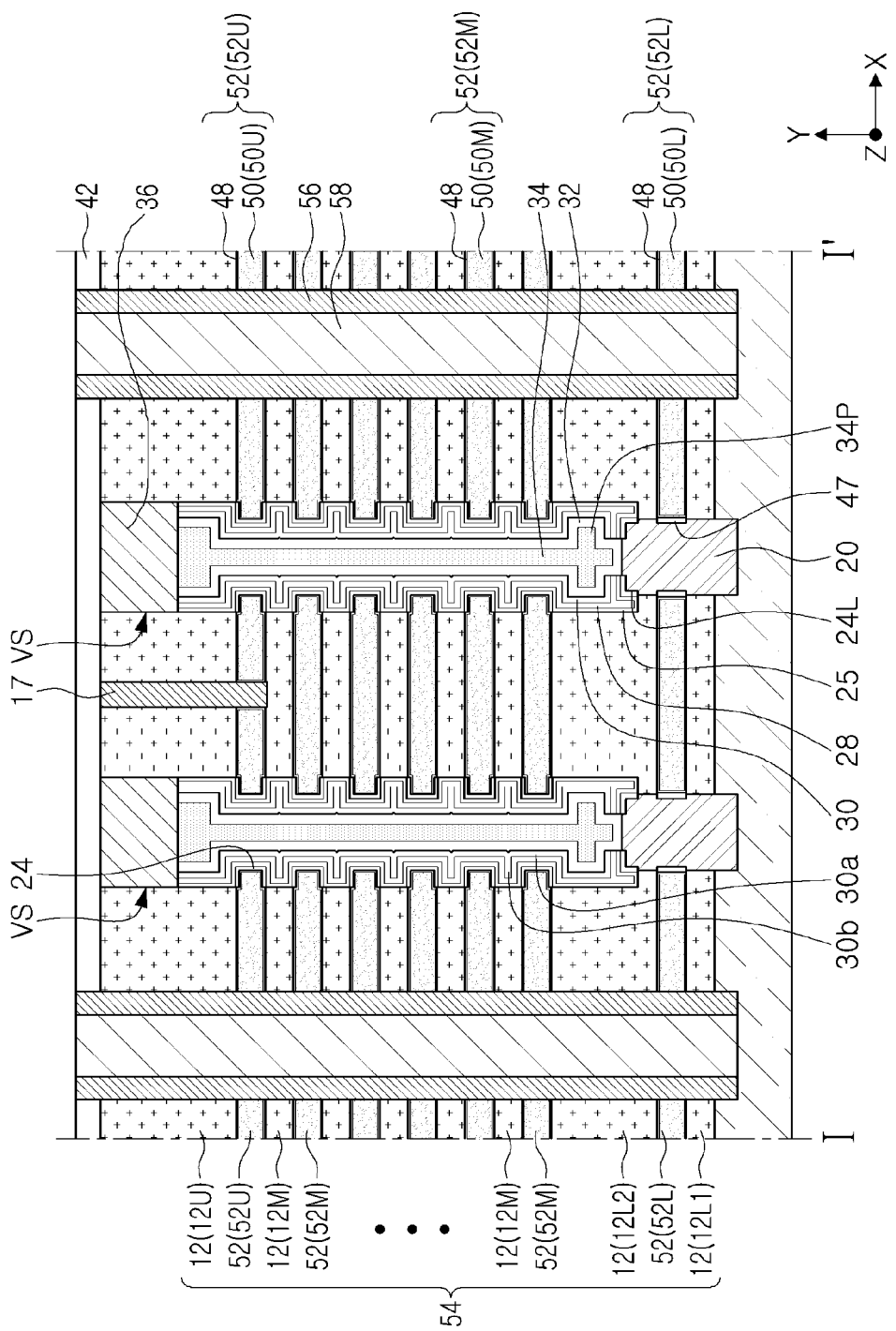

Referring to FIGS. 3 and 22, the semiconductor pattern 20 exposed by the empty spaces 46 may be oxidized to form an additional dielectric layer 47. Subsequently, gate patterns 52 may be formed to fill the empty spaces 46. Forming the gate patterns 52 may include forming first material layers 48 covering the inner walls of the empty spaces 46 and then forming second material layers 50 filling the empty spaces 46. Therefore, the gate patterns 52 as described above with reference to FIGS. 3 to 6B may be formed.

Next, spacers 56 may be formed on sidewalls of the separation trenches 44 (see FIG. 21), and separation patterns 58 are formed to fill the separation trenches 44 (see FIG. 21), between the spacers 56.

Referring again to FIGS. 3 to 6B, a second capping insulating layer 62 may be formed on the first capping insulating layer 42, and contact plugs 64 may be formed to penetrate through the first and second capping insulating layers 42 and 62 to be electrically connected to the vertical memory structures VS. A conductive line 66 may be formed on the contact plugs 64.

According to example embodiments, the data storage layer 28 may be disposed between the channel semiconductor layer 32 and the cell gate patterns 52M and may be extended between the channel semiconductor layer 32 and the interlayer insulating layers 12M, to overlap the extension portions 52E. Thus, the data storage layer 28 may overlap upper and lower surfaces of the extension portions 52E, and may extend to be vertically between adjacent gate patterns 52.

The data storage layer 28 may include data storage areas 28*d* (see FIG. 5) capable of storing information in a region thereof in which the channel semiconductor layer 32 and the cell gate patterns 52M face each other.

According to example embodiments, by providing the data storage layer 28 overlapping the upper and lower surfaces of the extension portions 52E, a phenomenon that in any one data storage layer 28, electrons or holes trapped within the data storage areas 28*d* move to regions other than the data storage areas 28*d*, may be significantly reduced. Thus, information retention characteristics of the semiconductor device according to an example embodiment, including the data storage layer 28, may be improved.

As set forth above, according to an example embodiment, a semiconductor device in which the degree of integration may be improved may be provided.

According to an example embodiment, a semiconductor device in which data retention characteristics may be improved may be provided.

While example embodiments have been shown and described above, it will be apparent to those skilled in the art that modifications and variations could be made without departing from the scope of the present inventive concept as defined by the appended claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor device comprising:
a stacked structure including interlayer insulating layers and cell gate patterns alternately stacked on a substrate; and
a vertical memory structure disposed on the substrate and having sides facing sides of the interlayer insulating layers and the cell gate patterns,
wherein
the cell gate patterns include overlapping portions vertically overlapping the interlayer insulating layers, and extension portions extending from the overlapping portions in a direction parallel to an upper surface of the substrate and which do not vertically overlap the interlayer insulating layers,
each of the extension portions has a vertical thickness less than a vertical thickness of each of the overlapping portions,
the vertical memory structure includes a channel semiconductor layer extending in a direction perpendicular to the upper surface of the substrate, and a dielectric structure disposed between the channel semiconductor layer and the stacked structure, and
the dielectric structure includes horizontally protruding regions extending between the extension portions to vertically overlap the extension portions, the horizontally protruding regions facing the interlayer insulating layers,
wherein:
the cell gate patterns include a first cell gate pattern,
the interlayer insulating layers include a first interlayer insulating layer adjacent to the first cell gate pattern,
the dielectric structure comprises a first dielectric layer, a data storage layer and a second dielectric layer,
the data storage layer is disposed between the first dielectric layer and the second dielectric layer,
the second dielectric layer is disposed between the data storage layer and the channel semiconductor layer,
the first dielectric layer is disposed between the data storage layer and the cell gate patterns,
the first dielectric layer extends from a portion thereof interposed between the data storage layer and the cell gate patterns into a gap between the data storage layer and the interlayer insulating layer,
the first dielectric layer includes a first portion located between a center of the first cell gate pattern and the data storage layer, and a second portion located between a center of the first interlayer insulating layer and the data storage layer,
the center of the first cell gate pattern is between an upper surface of the first cell gate pattern and a bottom surface of the first cell gate pattern,
the center of the first interlayer insulating layer is between an upper surface of the first interlayer insulating layer and a bottom surface of the first interlayer insulating layer, and
a horizontal thickness of the first portion of the first dielectric layer is greater than a horizontal thickness of the second portion of the first dielectric layer.

2. The semiconductor device of claim 1, wherein the first dielectric layer includes first layers in contact with the cell gate patterns, and a second layer interposed between the first layers and the data storage layer and extending between the interlayer insulating layers and the data storage layer.

3. The semiconductor device of claim 2, wherein the first layers are oxidation layers, and the second layer is a deposition layer.

4. The semiconductor device of claim 3, wherein the first layers are oxidation layers formed by oxidizing a silicon nitride or polysilicon.

5. The semiconductor device of claim 1, wherein each of the horizontally protruding regions includes a portion of the first dielectric layer and a portion of the data storage layer.

6. The semiconductor device of claim 5, wherein each of the horizontally protruding regions further includes a portion of the second dielectric layer.

7. The semiconductor device of claim 2, wherein the second dielectric layer includes a first portion in contact with the channel semiconductor layer and a second portion extending in a direction from the first portion of the second dielectric layer toward the interlayer insulating layers,
wherein at least a portion of the second portion of the second dielectric layer vertically overlaps the extension portions.

8. The semiconductor device of claim 7, further comprising an air gap disposed in the second portion of the second dielectric layer.

9. The semiconductor device of claim 1, wherein the data storage layer includes a first portion in contact with the second dielectric layer and a second portion extending in a direction from the first portion of the data storage layer toward the interlayer insulating layers,
wherein at least a portion of the second portion of the data storage layer vertically overlaps the extension portions.

10. The semiconductor device of claim 9, further comprising an air gap disposed in the second portion of the data storage layer.

11. The semiconductor device of claim 1, wherein each of the cell gate patterns has a vertical thickness decreasing from a portion of the overlapping portion adjacent to the extension portion, to a side surface of the extension portion.

12. The semiconductor device of claim 1, wherein the channel semiconductor layer does not vertically overlap the cell gate patterns.

13. A semiconductor device comprising:
a stacked structure including interlayer insulating layers and cell gate patterns alternately stacked on a substrate; and
a vertical memory structure disposed on the substrate and having sides facing sides of the interlayer insulating layers and the cell gate patterns,
wherein
the cell gate patterns include overlapping portions overlapping the interlayer insulating layers and extension portions extending from the overlapping portions in a horizontal direction parallel to an upper surface of the substrate, each of the extension portions has a vertical thickness less than a vertical thickness of each of the overlapping portions, the cell gate patterns include a first cell gate pattern, the interlayer insulating layers include a first interlayer insulating layer adjacent to the first cell gate pattern, each of the cell gate patterns includes a first material layer and a second material layer, the first material layer being interposed between the second material layer and the vertical memory structure and extending between the second material layer and the interlayer insulating layers, the vertical memory structure includes a channel semiconductor layer extending in a vertical direction perpendicular to the upper surface of the substrate, and a dielectric structure disposed between the channel semiconductor layer and the stacked structure, the dielectric structure includes a data storage layer, the data storage layer is disposed between the channel semiconductor layer and the cell gate patterns and extends between the channel semiconductor layer and the interlayer insulating layers to overlap the extension portions in the vertical direction, the dielectric structure further includes a first dielectric layer interposed between the data storage layer and the cell gate patterns, and a second dielectric layer disposed between the data storage layer and the channel semiconductor layer, the second dielectric layer includes a first portion located between a center of the first cell gate pattern and the channel semiconductor layer, and a second portion located between a center of the first interlayer insulating layer and the channel semiconductor layer, the center of the first cell gate pattern is between an upper surface of the first cell gate pattern and a bottom surface of the first cell gate pattern, the center of the first interlayer insulating layer is between an upper surface of the first interlayer insulating layer and a bottom surface of the first interlayer insulating layer, and a horizontal thickness of the second portion of the second dielectric layer is greater than a horizontal thickness of the first portion of the second dielectric layer.

14. The semiconductor device of claim 13, wherein the first material layer is formed of a dielectric material, and the second material layer is formed of a conductive material.

15. The semiconductor device of claim 7, wherein the channel semiconductor layer does not vertically overlap the cell gate patterns.

16. A semiconductor device comprising:

interlayer insulating layers stacked on a substrate and spaced apart from each other;

a gate pattern having an overlapping portion disposed vertically between the interlayer insulating layers and an extension portion extending from the overlapping portion in a direction parallel to an upper surface of the substrate and which does not overlap the interlayer insulating layers in a vertical direction; and a vertical memory structure on the substrate, wherein the vertical memory structure includes a channel semiconductor layer and a dielectric structure, the channel semiconductor layer extends in a direction perpendicular to the upper surface of the substrate to have side surfaces that face side surfaces of the interlayer insulating layers and a side surface of the extension portion of the gate pattern, the dielectric structure is disposed between the channel semiconductor layer and the gate pattern and extends between the channel semiconductor layer and the interlayer insulating layers, and the extension portion has a vertical thickness less than a vertical thickness of the overlapping portion.

17. The semiconductor device of claim 16, wherein the dielectric structure includes a first dielectric layer, a data storage layer, and a second dielectric layer, the data storage layer is interposed between the first dielectric layer and the second dielectric layer, the second dielectric layer is interposed between the data storage layer and the channel semiconductor layer, the first dielectric layer is interposed between the data storage layer and the gate pattern, and the data storage layer is disposed between the channel semiconductor layer and the gate pattern and extends between the channel semiconductor layer and the interlayer insulating layers to vertically overlap a lower surface and an upper surface of the extension portion.

18. The semiconductor device of claim 16, wherein the channel semiconductor layer does not vertically overlap the gate pattern.

* * * * *